United States Patent
Tomioka et al.

(10) Patent No.: US 10,714,370 B2
(45) Date of Patent: Jul. 14, 2020

(54) MOUNTING TABLE AND PLASMA PROCESSING APPARATUS

(71) Applicant: TOKYO ELECTRON LIMITED, Tokyo (JP)

(72) Inventors: Taketoshi Tomioka, Miyagi (JP); Taku Gohira, Miyagi (JP); Toshiyuki Makabe, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 391 days.

(21) Appl. No.: 14/191,953

(22) Filed: Feb. 27, 2014

(65) Prior Publication Data
US 2014/0238609 A1    Aug. 28, 2014

Related U.S. Application Data

(60) Provisional application No. 61/776,898, filed on Mar. 12, 2013.

(30) Foreign Application Priority Data

Feb. 28, 2013  (JP) ................. 2013-038814
Jan. 29, 2014  (JP) ................. 2014-014180

(51) Int. Cl.
  *H01L 21/683*   (2006.01)
  *H01L 21/67*    (2006.01)
  *H01L 21/687*   (2006.01)

(52) U.S. Cl.
  CPC .... *H01L 21/6831* (2013.01); *H01L 21/67109* (2013.01); *H01L 21/6875* (2013.01); *Y10T 279/23* (2015.01)

(58) Field of Classification Search
  USPC ............... 118/728–732; 156/345.51–345.55
  See application file for complete search history.

(56) References Cited

U.S. PATENT DOCUMENTS 6,951,587 B1 * 10/2005 Narushima .......... C23C 16/4586
                                                    118/728
6,960,743 B2 * 11/2005 Hiramatsu ........ H01L 21/67103
                                                    219/444.1

(Continued)

FOREIGN PATENT DOCUMENTS

JP          2011009351 A1     1/2011

*Primary Examiner* — Karla A Moore
*Assistant Examiner* — Tiffany Z Nuckols
(74) *Attorney, Agent, or Firm* — Rothwell, Figg, Ernst & Manbeck, P.C.

(57) ABSTRACT

A mounting table includes a base and an electrostatic chuck provided on the base. The base has first and second top surface on which the electrostatic chuck and a focus ring are respectively provided. The second top surface is provided below the first top surface. A coolant path in the base has central and peripheral paths extending below the first and second top surfaces, respectively. The peripheral path has a portion extending along a side surface toward the first top surface. The mounting surface has central and peripheral regions. The mounting surface has protrusions formed in a dot shape. The protrusions are formed such that a contact area between the protrusions of the peripheral region and the backside of an object per unit area becomes greater than a contact area between the protrusions of the central region and the backside of the object per unit area.

13 Claims, 27 Drawing Sheets

(56) References Cited

U.S. PATENT DOCUMENTS

| | | | | |
|---|---|---|---|---|
| 2001/0001953 A1* | 5/2001 | Griffiths | ............. | C23C 16/4583 |
| | | | | 118/728 |
| 2006/0118243 A1* | 6/2006 | Choi | ................ | H01L 21/67109 |
| | | | | 156/345.51 |
| 2007/0217114 A1* | 9/2007 | Sasaki | .................. | C23C 14/505 |
| | | | | 361/145 |
| 2008/0092818 A1* | 4/2008 | Fink | ................ | H01L 21/67103 |
| | | | | 118/724 |
| 2008/0121344 A1* | 5/2008 | Aramaki | ............ | C23C 16/4581 |
| | | | | 156/345.43 |
| 2010/0122774 A1* | 5/2010 | Makabe | ........... | H01J 37/32431 |
| | | | | 156/345.52 |
| 2010/0326957 A1* | 12/2010 | Maeda | ................... | H01J 37/20 |
| | | | | 216/67 |
| 2011/0024047 A1* | 2/2011 | Nguyen | ............... | C23C 14/564 |
| | | | | 156/345.51 |
| 2012/0160808 A1* | 6/2012 | Kikuchi | ........... | H01J 37/32165 |
| | | | | 216/67 |

\* cited by examiner

FIG.17

| BOUNDARY POSITION $r_{c/e}$ | $\Delta T$ [°C] | DECREASE RATIO FOR CASE OF UNIFORM CONTACT AREA RATIO[%] |
|---|---|---|
| UNIFORM CONTACT AREA RATIO(Ref.) | 15.2 | — |
| 100mm | 13.1 | 13.7 |
| 110mm | 12.5 | 17.8 |
| 120mm | 11.5 | 24.3 |
| 130mm | 9.8 | 35.4 |
| 135mm | 8.6 | 43.4 |
| 140mm | 9.0 | 40.4 |
| 145mm | 12.0 | 21.2 |

MOUNTING TABLE AND PLASMA PROCESSING APPARATUS

CROSS-REFERENCES TO RELATED APPLICATIONS

The present invention claims priority of Japanese Patent Application Nos. 2013-038814 and 2014-014180 respectively filed on Feb. 28, 2013 and Jan. 29, 2014, and U.S. Provisional Application No. 61/776,898 filed on Mar. 12, 2013, the entire contents of which are incorporated herein by reference.

FIELD OF THE INVENTION

The present invention relates to a mounting table and a plasma processing apparatus.

BACKGROUND OF THE INVENTION

As for a mounting table for mounting thereon an object to be processed (wafer) and a focus ring, there is disclosed a mounting table including a base portion having a coolant path formed therein and an electrostatic chuck for electrostatically attracting the object to be processed, the electrostatic chuck being provided on the base portion and having a contact surface that contacts with a backside of the object to be processed (see, e.g., Japanese Patent Application Publication No. 2011-9351). In the mounting table disclosed in Japanese Patent Application Publication No. 2011-9351, the base portion has a first top surface on which the electrostatic chuck is disposed, a ring-shaped second top surface which is disposed at a position lower than the first top surface and outer than the first top surface and on which the focus ring is provided, and a side surface extending in a vertical direction between the first top surface and the second top surface. In this mounting table, a first path disposed below the first top surface and a second path disposed below the second top surface are provided as a coolant path.

Further, gas grooves for uniformly distributing a heat transfer gas to the backside of the object to be processed are provided on the top surface of the electrostatic chuck which contacts with the backside of the object to be processed. Due to the presence of the gas grooves, protrusions are formed on the top surface of the electrostatic chuck.

However, in the mounting table disclosed in Japanese Patent Application Publication No. 2011-9351, heat from the focus ring is transferred to the mounting table (e.g., an inner side surface of the mounting table) via a member provided above the second path, and this may affect a temperature of an edge region of the object to be processed. Therefore, the temperature distribution becomes non-uniform between the central region and the edge region of the object to be processed. As a result, the quality of the object to be processed may deteriorate.

SUMMARY OF THE INVENTION

In this technical field, it is required to suppress non-uniform temperature distribution between a central region and an edge region of an object to be processed.

In accordance with an aspect of the present invention, there is provided a mounting table for mounting thereon an object to be processed and a focus ring, including: a base portion having a coolant path formed therein; and an electrostatic chuck provided on the base portion, the electrostatic chuck having a mounting surface for mounting thereon the object and serving to electrostatically attract the object. The base portion includes a first top surface on which the electrostatic chuck is provided; a ring-shaped second top surface on which the focus ring is provided, the second top surface provided below the first top surface at an outer side of the first top surface; and a side surface extending in a vertical direction between the first top surface and the second top surface. The coolant path includes: a central path extending below the first top surface; and a peripheral path extending below the second top surface and having a portion extending along the side surface toward the first top surface. The mounting surface includes: a central region; and a peripheral region surrounding the central region. The mounting surface has thereon a plurality of protrusions which are formed in a dot shape to contact with the backside of the object. The protrusions are formed such that a contact area between the protrusions of the peripheral region and the backside of the object per unit area becomes greater than a contact area between the protrusions of the central region and the backside of the object per unit area.

In accordance with another aspect of the present invention, there is provided a plasma processing apparatus including: a mounting table for mounting thereon an object to be processed and a focus ring. The mounting table includes: a base portion having a coolant path formed therein; and an electrostatic chuck provided on the base portion, the electrostatic chuck having a mounting surface for mounting thereon the object and serving to electrostatically attract the object. The base portion includes: a first top surface on which the electrostatic chuck is provided; a ring-shaped second top surface on which the focus ring is provided, the second top surface provided below the first top surface at an outer side of the first top surface; and a side surface extending in a vertical direction between the first top surface and the second top surface. The coolant path includes: a central path extending below the first top surface; and a peripheral path extending below the second top surface and having a portion extending along the side surface toward the first top surface. The mounting surface includes: a central region; and a peripheral region surrounding the central region. The mounting surface has thereon a plurality of protrusions which are formed in a dot shape to contact with the backside of the object. The protrusions are formed such that a contact area between the protrusions of the edge region and the backside of the object per unit area becomes greater than a contact area between the protrusions of the central region and the backside of the object per unit area.

BRIEF DESCRIPTION OF THE DRAWINGS

The objects and features of the present invention will become apparent from the following description of embodiments, given in conjunction with the accompanying drawings, in which:

FIG. 17 is a table showing a decrease rate of variation ΔT of temperature distribution in accordance with the boundary position between the central region and the peripheral region of the mounting surface;

DETAILED DESCRIPTION OF THE EMBODIMENTS

Figure 1:
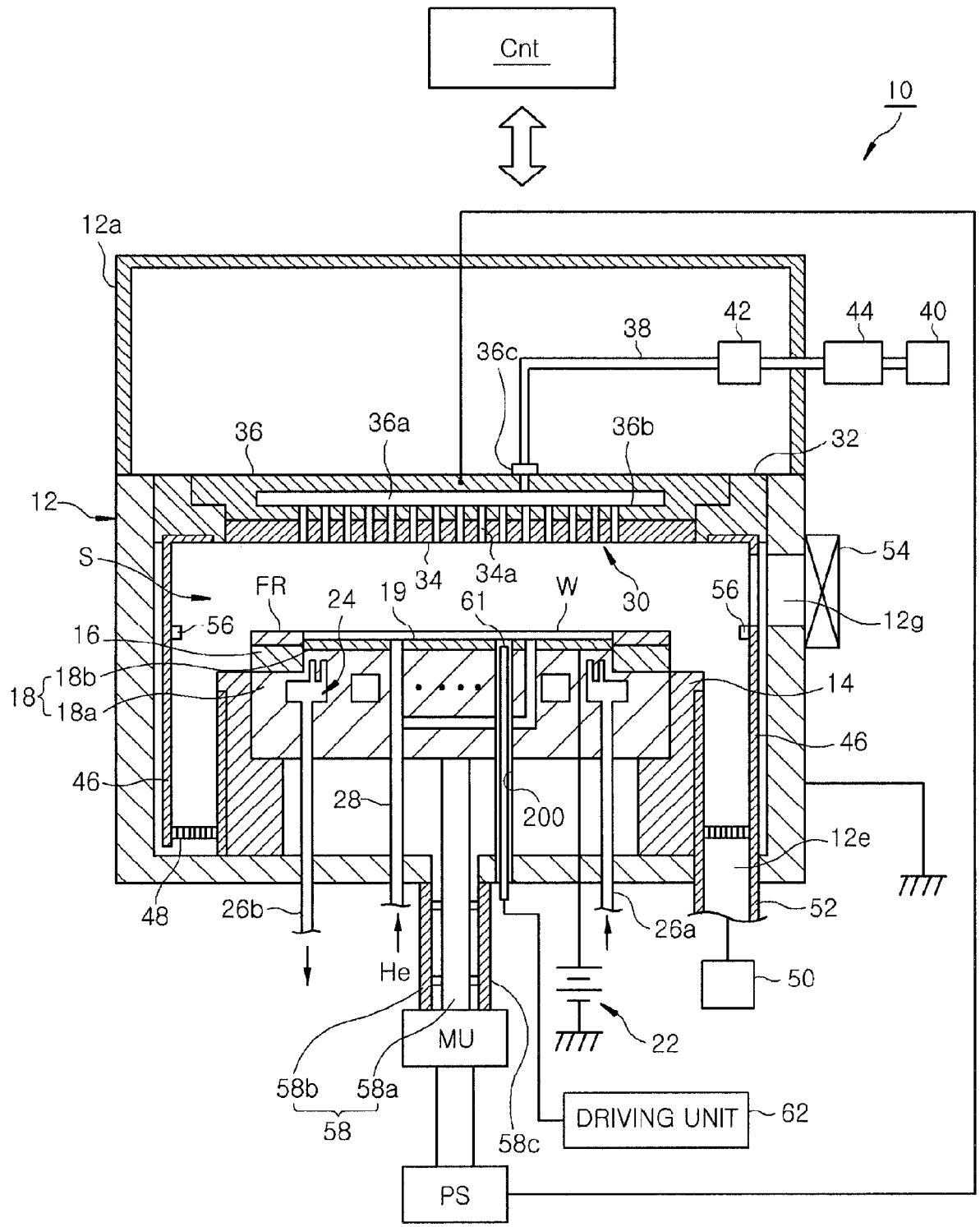
FIG. 1 is a schematic cross sectional view showing a configuration of a plasma processing apparatus in accordance with an embodiment of the present invention.

Hereinafter, embodiments of the present invention will be described with reference to the accompanying drawings. Further, like reference numerals will be used for like or corresponding parts throughout the drawings.

FIG. 1 is a schematic cross sectional view showing a configuration of a plasma processing apparatus in accordance with an embodiment of the present invention. A plasma processing apparatus 10 shown in FIG. 1 is configured as a capacitively coupled parallel plate type etching apparatus, and includes a substantially cylindrical processing chamber 12. The processing chamber 12 has an inner wall surface made of anodically oxidized aluminum. The processing chamber 12 is frame grounded.

A substantially cylindrical supporting part 14 made of an insulating material is provided on the bottom portion of the processing chamber 12. Inside the processing chamber 12, the supporting part 14 extends in a vertical direction from the bottom portion of the processing chamber 12. The supporting part 14 supports the mounting table 18 provided in the processing chamber 12. Specifically, the supporting part 14 can support the mounting table 18 at the inner wall surface of the supporting part 14, as shown in FIG. 1.

The mounting table 18 has a base portion 18a and an electrostatic chuck 18b. The base portion 18a is made of a metal, e.g., aluminum, and has a substantially disc shape. The base portion 18a serves as a lower electrode. The electrostatic chuck 18b is provided on the base portion 18a. As will be described later in detail, the electrostatic chuck 18b has a structure in which an electrode made of a conductive film is disposed between a pair of insulating layers or insulating sheets. A DC power supply 22 is electrically connected to the electrode of the electrostatic chuck 18b. The electrostatic chuck 18b can electrostatically attract the wafer W by an electrostatic force such as a Coulomb force generated by a DC voltage from the DC power supply 22. In a state where the wafer W is electrostatically attracted, the backside of the wafer W comes into contact with a mounting surface 19 that is the top surface of the electrostatic chuck 18b.

A spacer 16 made of a dielectric material is provided on the peripheral portion of the base portion 18a of the mounting table 18. A focus ring FR is provided on the spacer 16 so as to surround the periphery of the wafer W and the electrostatic chuck 18b. The focus ring FR is provided to improve the uniformity of etching. The focus ring FR is made of a material selected in accordance with a material of a film to be etched. For example, it may be made of quartz.

The base portion 18a has therein a coolant path 24. A coolant of a predetermined temperature is supplied from a chiller unit provided outside and circulated in the coolant path 24 through lines 26a and 26b. The coolant is an insulating solution, e.g., Galden (Registered Trademark). By controlling the temperature of the circulating coolant, the temperature of the wafer W supported on the mounting table 18 is controlled.

Further, the plasma processing apparatus 10 has a gas supply line 28. The gas supply line 28 supplies a heat transfer gas from a heat transfer gas supply unit, e.g., He gas, to a gap between the top surface of the electrostatic chuck 18b and the backside of the wafer W.

Moreover, the mounting table 18 is provided with a plurality of, e.g., three, lifter pin holes 200 (only one is shown in the drawing). Lifter pins 61 are respectively provided inside the lifter pin holes 200. The lifter pins 61 are connected to a driving unit 62 and vertically moved by the driving unit 62.

Furthermore, an upper electrode 30 is provided inside the processing chamber 12. The upper electrode 30 is provided above the mounting table 18 so as to face the mounting table 18. The upper electrode 30 is in parallel with the base portion 18a. A processing space S where the plasma processing is performed on the wafer W is formed between the upper electrode 30 and the base portion 18a.

The upper electrode 30 is held at an upper portion of the processing chamber 12 through an insulating shielding member 32. The upper electrode 30 may include an electrode plate 34 and an electrode holder 36. The electrode plate 34 faces the processing space S and has a plurality of gas injection openings 34a. The electrode plate may be made of a semiconductor or a conductor of low resistance having small Joule heat.

The electrode holder 36 detachably holds the electrode plate 34, and may be made of a conductive material, e.g., aluminum. The electrode holder 36 may have a water cooling structure. The electrode holder 36 has therein a gas diffusion spacer 36a. A plurality of gas through holes 36b communicating with the gas injection openings 34a extends downward from the gas diffusion space 36a. Further, the electrode holder 36 has a gas inlet 36c for introducing a processing gas into the gas diffusion space 36a. A gas supply line 38 is connected to the gas inlet 36c. A gas source group 40 is connected to the gas supply line 38 via a valve group 42 and a flow rate control group 44.

The plasma processing apparatus 10 may also have a ground conductor 12a. The ground conductor 12a has a substantially cylindrical shape and extends from the sidewall of the processing chamber 12 to a position above the upper electrode 30.

Further, in the plasma processing apparatus 10, a deposition shield 46 is detachably provided along the inner wall of the processing chamber 12. The deposition shield 46 is also provided at the periphery of the supporting part 14. The deposition shield 46 prevents adhesion of etching by-products to the processing chamber 12 and is formed by coating ceramic such as $Y_2O_3$ or the like on an aluminum material.

On the bottom portion of the processing chamber 12, a gas exhaust plate 48 is provided between the supporting part 14 and the inner wall of the processing chamber 12. The gas exhaust plate 48 is formed by coating ceramic such as $Y_2O_3$ or the like on an aluminum material, for example. In the processing chamber 12, a gas exhaust port 12e is provided below the gas exhaust plate 48. A gas exhaust unit 50 is connected to the gas exhaust port 12e through a gas exhaust line 52. The gas exhaust unit 50 has a vacuum pump such as a turbomolecular pump or the like, so that the pressure in the processing chamber 12 can be reduced to a desired vacuum level. Further, a loading/unloading port 12g for a wafer W is provided at the sidewall of the processing chamber 12 and can be opened and closed by a gate valve 54.

A conductive member (GND block) 56 is provided on the inner wall of the processing chamber 12. The conductive member 56 is adhered to the inner wall of the processing chamber 12 so as to be positioned at the same height level as that of the wafer W. The conductive member 56 is DC-connected to the ground and prevents abnormal discharge. Further, the conductive member 56 may be provided at any position in the plasma generation region, and the installation position thereof is not limited to the position shown in FIG. 1.

In addition, the plasma processing apparatus 10 includes a power supply rod 58 for supplying a high frequency power to the base portion 18a. The power supply rod 58 has a coaxial double tube structure including a rod-shaped conductive member 58a and a cylindrical conductive member 58b. The rod-shaped conductive member 58a extends in a substantially vertically direction from the outside of the processing chamber 12 toward the inside of the processing chamber 12 through the bottom portion of the processing chamber 12. The upper end of the rod-shaped conductive member 58a is connected to the base portion 18a. Further, the cylindrical conductive member 58b is coaxially provided around the axis of the rod-shaped conductive member so as to surround the rod-shaped conductive member 58a. The cylindrical conductive member 58b is supported at the bottom portion of the processing chamber 12. Substantially ring-shaped two insulating members 58c are inserted between the rod-shaped conductive member 58a and the cylindrical conductive member 58b to electrically insulate the rod-shaped conductive member 58a and the cylindrical conductive member 58b from each other.

Besides, the plasma processing apparatus 10 may include a matching unit MU. The matching unit MU is connected to the lower ends of the rod-shaped conductive member 58a and the cylindrical conductive member 58b. The matching unit MU is connected to a power supply system PS. Moreover, the power system PS is connected to the upper electrode 30. The power system PS can supply two different high frequency powers to the base portion 18a and apply a DC voltage to the upper electrode 30.

Further, the plasma processing apparatus 10 may include a control unit Cnt. The control unit Cnt is a computer having a processor, a storage unit, an input device, a display device or the like, and controls each unit of the plasma processing apparatus 10, e.g., a power supply system, a gas supply system, a driving system, the power system PS or the like. In the control unit Cnt, an operator can input commands to manage the plasma processing apparatus 10 by using the input device and the operation state of the plasma processing apparatus 10 can be displayed on the display device. Further, the storage unit of the control unit Cnt stores therein a control program for controlling various processes performed in the plasma processing apparatus 10 by the processor, or a program, i.e., a processing recipe, for performing the processes of the components of the plasma processing apparatus 10 in accordance with the processing conditions.

Figure 2:
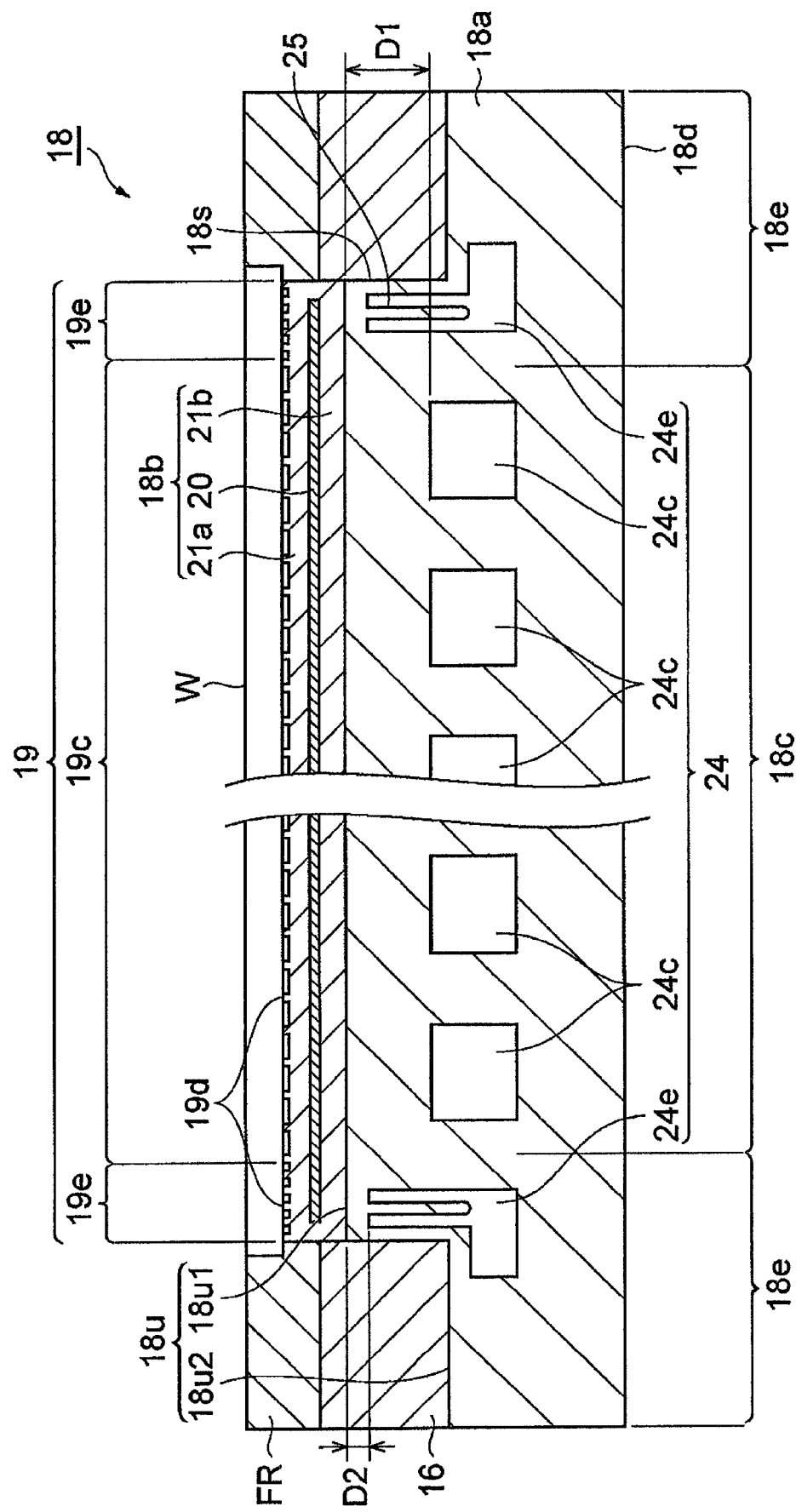
FIG. 2 is a schematic cross sectional view showing a mounting table of the plasma processing apparatus shown in FIG. 1.
Figure 3:
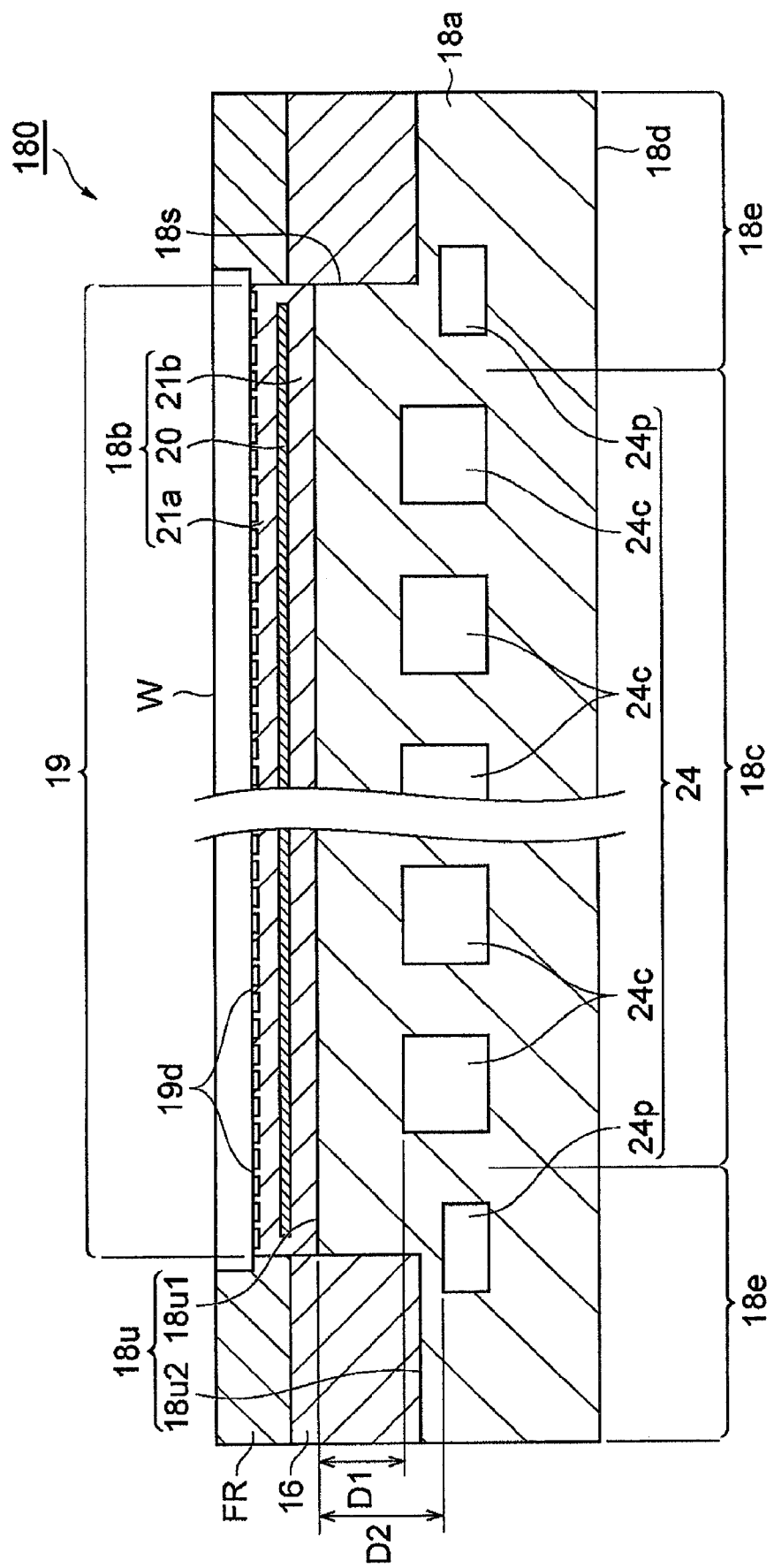
FIG. 3 is a schematic cross sectional view showing a conventional mounting table.
Figure 4:
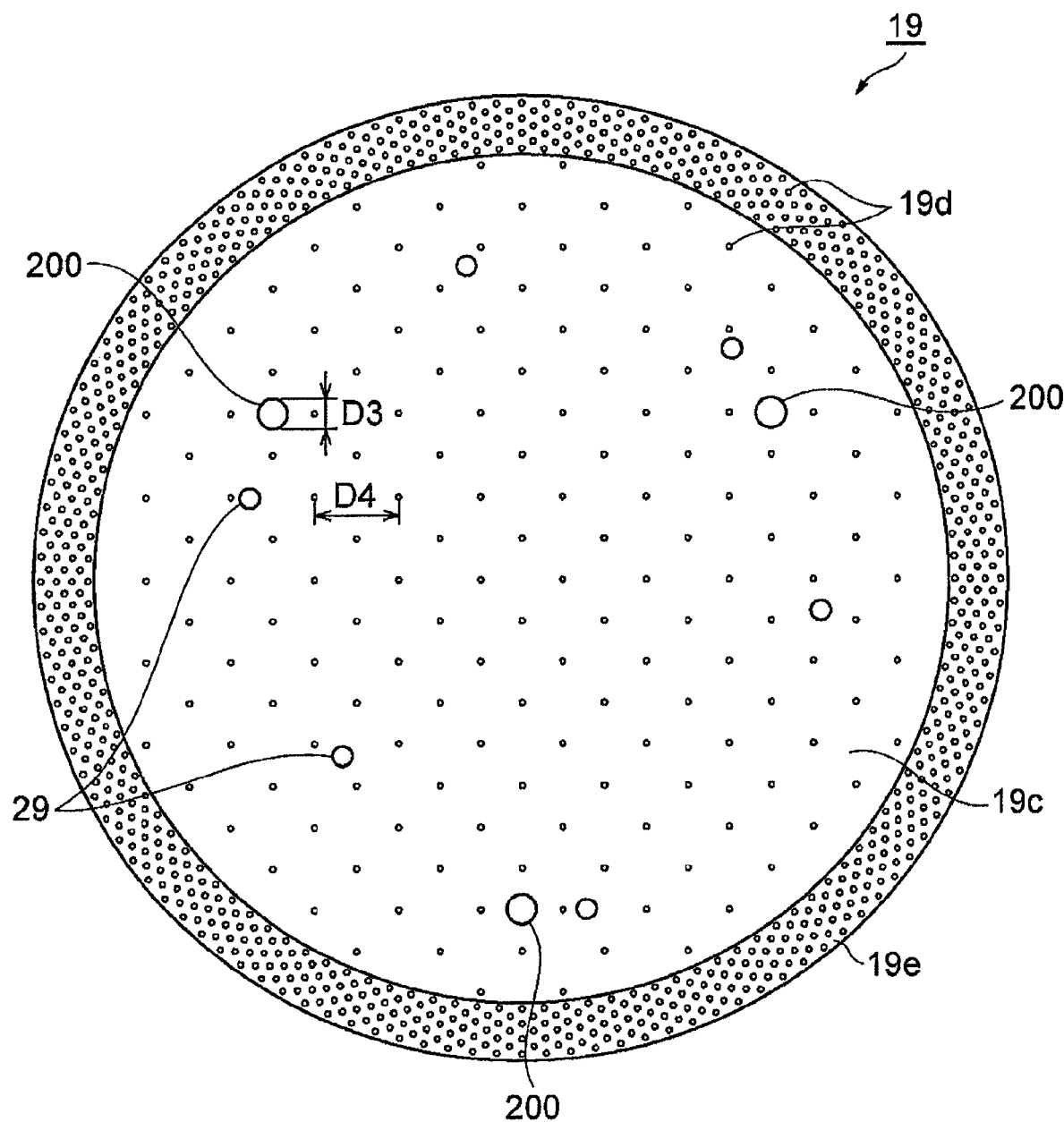
FIG. 4 is a top view showing a mounting surface of an electrostatic chuck of the mounting table shown in FIG. 2.

Hereinafter, the mounting table 18 of the plasma processing apparatus 10 will be described in detail in comparison with the conventional mounting table. FIG. 2 is a schematic cross sectional view showing a mounting table of the plasma processing apparatus shown in FIG. 1. FIG. 3 is a schematic cross sectional view showing the conventional mounting table. FIG. 4 is a top view showing a mounting surface of an electrostatic chuck of the mounting table shown in FIG. 2. As shown in FIG. 2, the bottom portion 18a of the mounting table 18 has a bottom surface 18d and a top surface 18u. The bottom surface 18d is a substantially flat surface, and the top surface 18u has a first top surface 18u1 and a second top surface 18u2. The first top surface 18u1 is a circular surface and positioned at an inner side of the second top surface 18u2. The second top surface 18u2 extends in a ring shape at the outer side of the first top surface. The second top surface 18u2 is positioned below the first top surface 18u1. In other words, the distance between the second top surface 18u2 and the bottom surface 18d is smaller than the distance between the first top surface 18u1 and the bottom surface 18d. The bottom portion 18a having the above-mentioned structure further has a ring-shaped side surface 18s that extends in a substantially vertical direction to connect the first top surface 18u1 and the second top surface 18u2.

The base portion 18a has a central portion 18c and a peripheral portion 18e. When the first top surface 18u1 is divided into the central region and the peripheral region, the top surface of the central portion 18c becomes the central region of the first top surface 18u1. Meanwhile, the top surface of the peripheral portion 18e includes the peripheral region of the first top surface 18u1 and the second top surface 18u2. The peripheral portion 18e and the central portion 18c have coolant paths 24 formed therein. For example, the coolant paths 24 extend in a spiral shape from the peripheral portion 18e of the base portion 18a to the vicinity of the center of the central portion 18c of the bottom portion 18a and also extends in a spiral shape from the vicinity of the center of the central portion 18c of the bottom portion 18a to the peripheral portion 18e of the bottom portion 18a.

The electrostatic chuck 18 is provided on the first top surface 18u1 of the mounting table 18. The electrostatic chuck 18b has a pair of insulating films 21a and 21b and an electrode 20 disposed between the insulating films 21a and 21b. The electrostatic chuck 18b has the mounting surface 18 for mounting thereon a wafer W. A plurality of protrusions 19d formed in a dot shape on the mounting surface 19. In the present embodiment, the protrusions 19d have the same shape and the same size. In a state where the wafer W is electrostatically attracted, the top surfaces of the protrusions 19d come into contact with the backside of the wafer W. Further, the focus ring FR is provided on the second top surface 18u2 via the spacer 16, the second top surface 18u2 being positioned below the first top surface 18u1. Accordingly, the focus ring FR surrounds the wafer W mounted on the electrostatic chuck 18b.

The above-described structure of the mounting table 18 is the same as that of the conventional mounting table 180 shown in FIG. 3. However, the mounting table 18 and the mounting table 180 are different from each other in the structures of the coolant path 24 and the mounting surface 19.

First, the structure of the coolant path 24 will be described. As shown in FIG. 3, the coolant path 24 of the conventional mounting table 180 includes a central path 24c and a peripheral path 24p. The peripheral path 24p is provided below the edge region of the wafer W. The peripheral path 24p extends below the peripheral region of the first top surface 18u1 and the second top surface 18u2.

Since the second top surface 18us is positioned above the peripheral path 24p as described above, the upper inner wall surface (upper end) of the peripheral path 24p is positioned below the inner wall surface (upper end) of the central path 24c. Therefore, a minimum distance D2 between the peripheral path 24p and the first top surface 18u1 is greater than a minimum distance D1 between the central path 24c and the first top surface 18u1. As a result, in the conventional mounting table 180, the heat extraction capacity of the peripheral path 24p, i.e., the capacity of absorbing heat from the wafer W, deteriorates compared to the heat extraction capacity of the central path 24c. In the mounting table 180, the heat from the plasma is transferred to the side surface 18s of the mounting table 180. Since, however, the peripheral path 24p is not provided at the side of the side surface 18s, the heat extraction from the edge region of the wafer W may be insufficient. Therefore, when the plasma processing is performed by the plasma processing apparatus having the conventional mounting table 180, the temperature gradient in which the temperature is increased toward the edge occurs in the edge region of the wafer W.

Meanwhile, as shown in FIG. 2, the coolant path 24 of the mounting table 18 of the present embodiment includes a peripheral path 24e different from the peripheral path 24p of the conventional mounting table 180. The peripheral path 24e extends below the peripheral region of the first top surface 18u1 and the second top surface 18u2. The peripheral path 24e has a substantially L-shaped cross section. In other words, the peripheral path 24e extends along the side surface 18s toward the first top surface 18u1 is provided. Accordingly, the capacity of the coolant path 24 which extracts the heat transferred to the inner side surface 18s of the mounting table 18 is improved. At the upper end of the peripheral path 24e, a fin portion 25 extending from the upper end toward the lower end of the peripheral path 24e is formed along the side surface 18s. Due to the shape of the peripheral path 24e, the surface area of the peripheral path 24e becomes greater than the surface area of the conventional peripheral path 24p. As a result, the capacity of the coolant path 24 of extracting heat from the edge region of the wafer W is improved. Further, the peripheral path 24e may become wider toward the radially outer side so as to be positioned below the entire surface of the second top surface 18u2.

Hereinafter, the structure of the mounting surface will be described. As shown in FIG. 3, a plurality of protrusions 19d is uniformly formed on the mounting surface 19 of the conventional mounting table 180. In other words, the protrusions 19d are formed such that the contact area between the top surfaces of the protrusions 19d and the backside of the wafer W per unit area becomes uniform over the entire region of the mounting surface 19.

Meanwhile, in the mounting surface 19 of the mounting table 18 of the present embodiment, the density of the protrusions 19d is changed in accordance with the region of the mounting surface 19, as shown in FIGS. 2 and 4. The mounting surface 19 includes a central region 19c that contacts with the central region of the wafer W and a peripheral region 19e that contacts with the edge region of the wafer W. The peripheral region 19e is positioned so as to surround the central region 19c. The protrusions 19d are formed such that the number of the protrusions 19d per unit area is greater in the peripheral region 19e than in the central region 19c. In other words, the protrusions 19d are formed such that the contact area between the protrusions 19d of the peripheral region 19e and the backside of the wafer W per unit area (hereinafter, referred to as "contact area ratio") is greater than the contact area between the protrusions 19d of the central region 19c and the backside of the wafer W per unit area.

As shown in FIG. 4, a plurality of (three in the present embodiment) lifter pin holes 200 and a plurality of (six in the present embodiment) gas holes 29 are formed in the central region 19c. The gas holes 29 are used for supplying He gas to a gap between the mounting surface 19 and the backside of the wafer W through the gas supply line 28. In the present embodiment, a gap D4 between the protrusions 19d is greater than a diameter D3 of the lifter pin holes 200.

Figure 5:
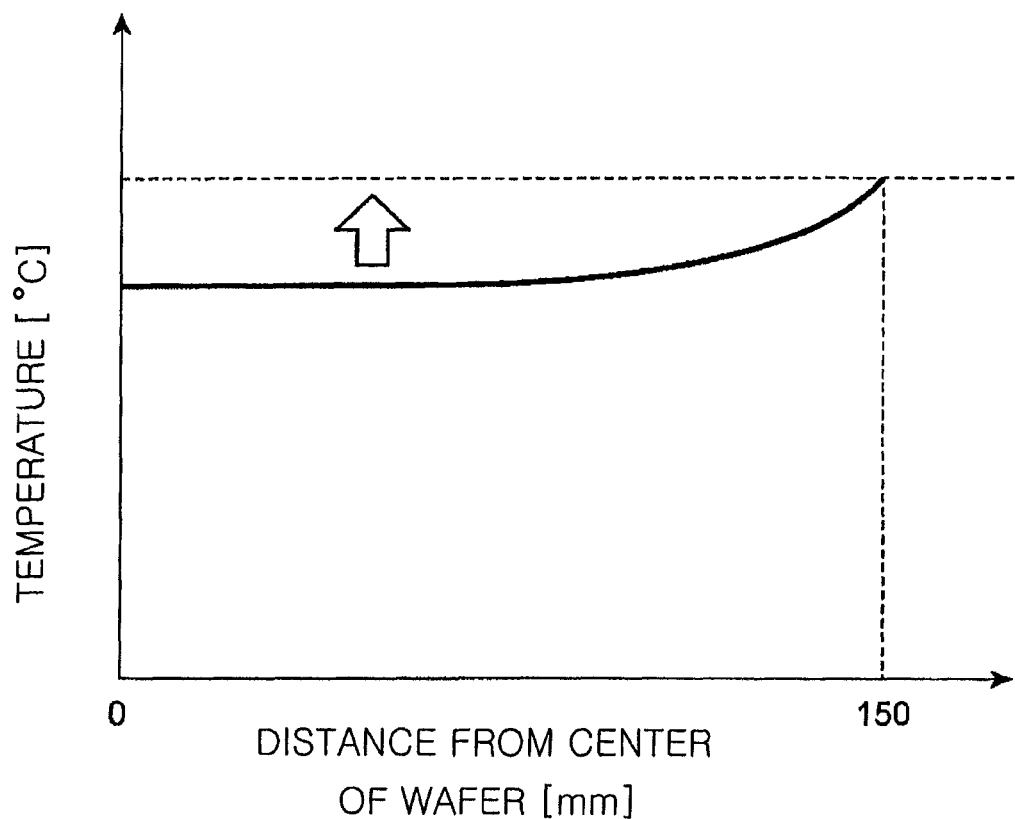
FIG. 5 is a graph explaining relationship between a temperature and a distance from a center of a wafer in the case of performing plasma processing in a conventional mounting table.

FIG. 5 is a graph explaining relationship between a temperature and a distance from the center of the wafer W in the case of performing plasma processing in the conventional mounting table. The horizontal axis indicates the distance from the center of the wafer W, and the vertical axis indicates the temperature. The heat of the wafer W is transferred through the protrusions 19d, the mounting table 18 and the coolant path 24 in that order to be extracted. The edge region of the wafer W is protruded beyond the mounting surface 19 of the mounting table 18 and the cooling at that region cannot be sufficiently performed. Therefore, the temperature in the edge region of the wafer W is higher than that in the central region of the wafer W. In accordance with the mounting table 18 of the present embodiment, the contact area between the mounting surface 19 and the wafer W per unit area is smaller in the central region 19c than in the peripheral region 19e. Therefore, the heat resistance is greater in the central region 19c than in the peripheral region 19e. As a consequence, the heat transfer in the central region 19c is poor compared to that in the peripheral region 19e. As a result, the temperature of the central region of the wafer W can be increased up to the temperature of the edge region of the wafer W, as indicated by an arrow of FIG. 5.

Hereinafter, the cause for temperature increase in the edge region of the wafer W in the case of using the conventional mounting table 180 and the operations and effects of the plasma processing apparatus 10 and the mounting table 18 of the present embodiment will be described in detail. Further, in the following description, a radius of the wafer W is set to 150 mm.

(Cause for Temperature Increase in the Edge Region of the Wafer W)

As described above, in the conventional mounting table 180, there are two main causes for temperature increase in the edge region of the wafer W. First, the heat input from the focus ring FR side (the heat input to the second top surface 18u2) is transferred to the first top surface 18u1 via the inside or the side surface of the mounting table 180. Second, since a part of the edge region of the wafer W is not covered by the mounting table 18, the corresponding portion does not in contact with the mounting surface 19 and thus is not sufficiently cooled.

(First Cause)

Figure 6A:
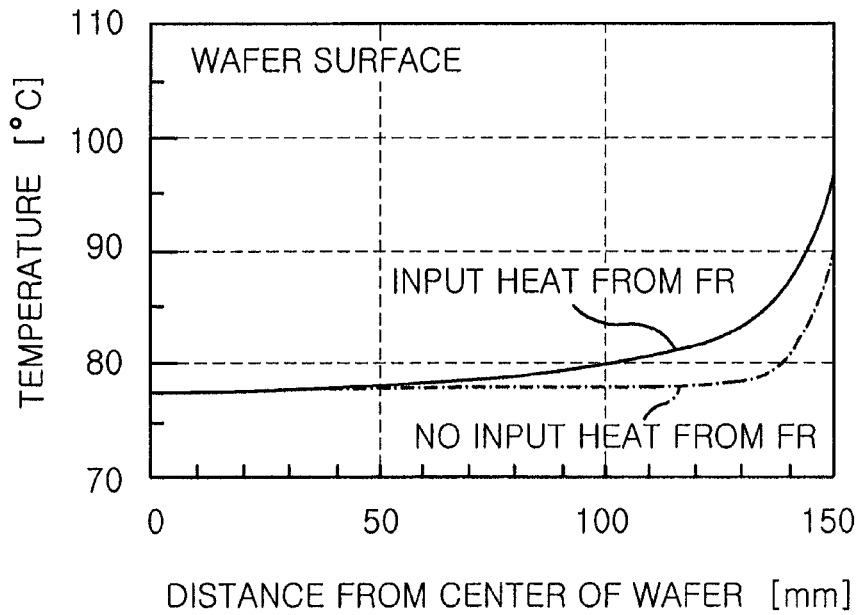
FIGS. 6A to 6C are graphs for comparing temperature distributions in an edge region of the wafer between when heat was input from the focus ring and when no heat was input from the focus ring in the case of using the conventional mounting table.
Figure 6B:
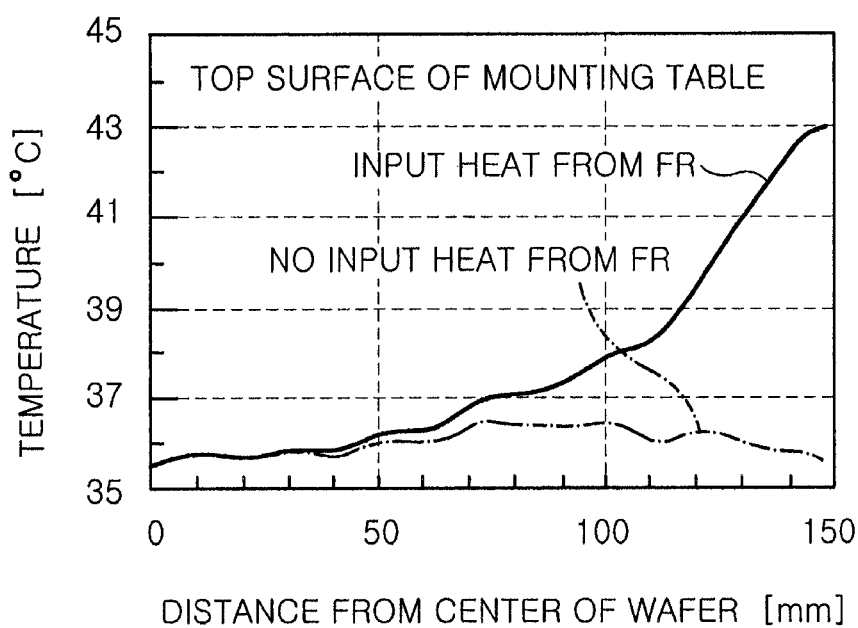
Figure 6C:
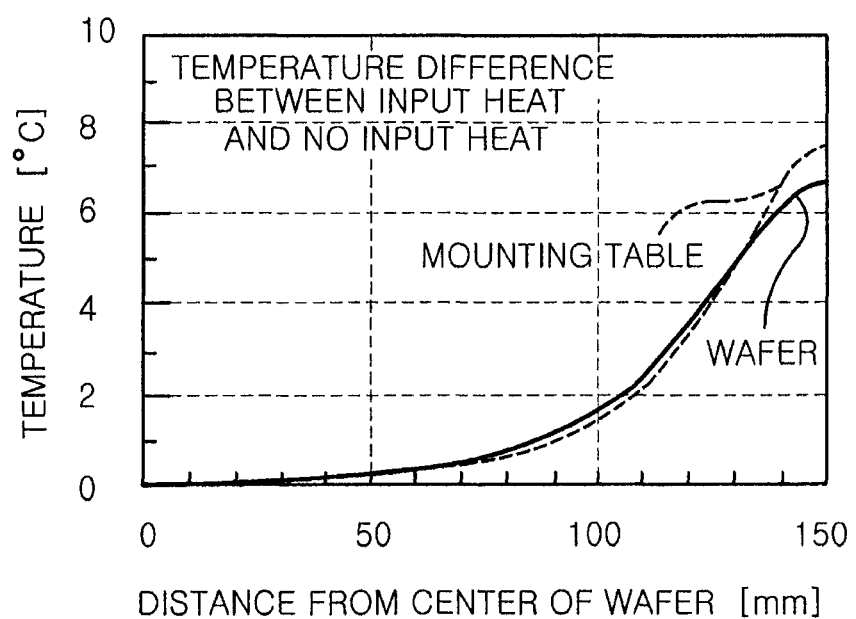

First, a simulation result of temperature distribution due to the first cause will be described. FIGS. 6A to 6C are graphs showing the simulation results for comparing temperature distributions in the edge region of the wafer W in the conventional mounting table 180 between the case where heat was input to the second top surface 18u2 and the case where heat was not input to the second top surface 18u2. Here, the difference in the temperature distribution between the case where heat is input to the second top surface 18u2 and the case where no heat is input to the second top surface 18u2 was checked in a state where heat was input to the wafer W.

FIG. 6A is a graph for comparing temperature distributions on the surface of the wafer W between the case where heat was input to the second top surface 18u2 and the case where no heat was input to the second top surface 18u2. The horizontal axis indicates a distance from the center (origin) of the wafer W, and the vertical axis indicates a temperature of the surface of the wafer W. In FIG. 6A, the solid line is a graph of the case where heat is input to the second top surface 18u2, and the dashed double-dotted line is a graph of the case where heat is not input to the second top surface 18u2. As shown in FIG. 6A, as the distance from the center of the wafer W is increased, the temperature difference with the temperature of the center was increased regardless of whether or not the heat was input to the second top surface 18u2. When the heat was not input to the second top surface 18u2, the temperature started to be increased abruptly from the position separated from the center by about 130 mm. In other words, it was seen that the temperature difference with the temperature of the center was great at the position spaced from the center by a distance of about 130 mm to 150 mm.

On the other hand, when the heat was input to the second top surface 18u2, the temperature started to be increased gradually from the position separated from the center by a distance of about 70 mm to 80 mm and started to be increased abruptly from the position separated from the center by a distance of about 130 mm. In other words, it was seen that the temperature difference with the temperature of the center was great at the position spaced from the center by a distance of about 70 mm to 150 mm. As described above, it was clear that the position where the temperature difference with the temperature of the center started to occur was shifted toward the center when the heat was input to the second top surface 18us compared to when no heat was input to the second top surface 18u2. In other words, the temperature of the surface of the wafer W was increased in a wide range when the heat was input to the second top surface 18u2 compared to when no heat was input to the second top surface 18u2.

FIG. 6B is a graph for comparing temperature distributions on the first top surface 18u1 of the conventional mounting table 180 between the case where heat was input to the second top surface 18u2 and the case where no heat was input to the second top surface 18u2. The horizontal axis indicates a distance from the center (origin) of the first top surface 18u1 of the mounting table 180, and the vertical axis indicates a temperature of the first top surface 18u1 of the mounting table 18. In FIG. 6B, the solid line is a graph of the case where the heat was input to the second top surface 18u2, and the dashed double-dotted line is a graph of the case where no heat was input to the second top surface 18u2. As shown in FIG. 6B, when no heat was input to the second top surface 18u2, the temperature of the center and the temperatures of other positions were substantially the same.

On the other hand, when the heat was input to the second top surface 18u2, the temperature started to be increased gradually from the position spaced from the center by a distance of about 50 mm and started to be increased abruptly from the position spaced from the center by a distance of about 130 mm. As described above, it was clear that, even in the mounting table 180 as well as the wafer W, the temperature difference with the temperature of the center was considerably great when the heat was input to the second top surface 18u2 compared to when no heat was input to the second top surface 18u2.

The temperature of the surface of the wafer W was increased in a wider range when the heat was input to the second top surface 18u2 compared to when no heat was input to the second top surface 18u2 because the temperature of the mounting table 180 was increased by the heat input to the second top surface 18u2.

FIG. 6C is a graph showing the temperature difference that occurs between when the heat is input to the second top surface 18u2 and when no heat is not input to the second top surface 18u2 (hereinafter, referred to as "temperature difference caused by the input/non-input of heat to the second top surface 18u2") in the temperature distributions on the wafer W and the first top surface 18u1 in the case of using the conventional mounting table 180. In FIG. 6C, the solid line is a graph showing the result for the wafer W, and the dashed line is a graph showing the result for the first top surface 18u1. In other words, the solid graph of FIG. 6C shows the difference between two graphs of FIG. 6A obtained when the heat was input to the second top surface 18u2 and when no heat was input to the second top surface 18u2 and also shows the temperature difference caused by the input/non-input of the heat to the second top surface 18u2 in the wafer W. In the same manner, the dashed line graph of FIG. 6C shows the difference between two graphs of FIG. 6B obtained when the heat was input to the second top surface 18u2 and when the heat was not input to the second top surface 18u2 and also shows the temperature difference caused by the input/non-input of the heat to the second top surface 18u2 in the first top surface 18u1 of the mounting table 180. As shown in FIG. 6C, in the case of the wafer W and the first top surface 18u1, the temperature difference caused by the input/non-input of the heat to the second top surface 18u2 was substantially the same. In other words, it was seen that the temperature of the surface of the wafer W was increased in a wide range due to the temperature increase in the edge region of the first top surface 18u1 of the mounting table 180 by the heat input to the second top surface 18u2.

As described above, it has been found that, in the conventional mounting table 180, the temperature increase in the edge region of the wafer W is caused by the heat input to the second top surface 18u2 (first cause).

Operation and Effect of the Mounting Table 18 of the Present Embodiment

Next, the operations and the effects of the plasma processing apparatus 10 and the mounting table 18 of the present embodiment will be described by using the simulation result.

Figure 7A:
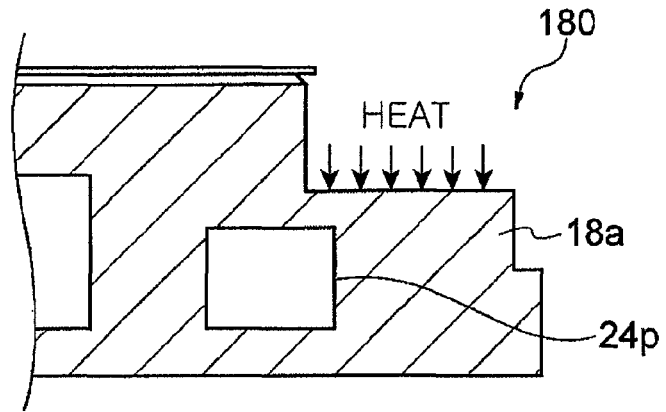
FIGS. 7A to 7C show a peripheral path of the conventional mounting table and a peripheral path of the mounting table of the present embodiment.
Figure 7B:
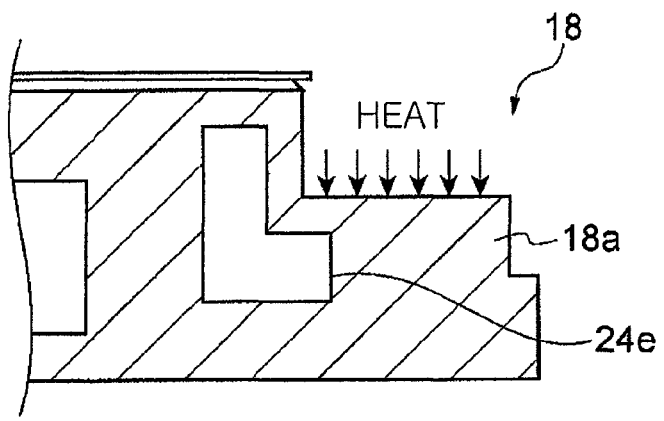
Figure 7C:
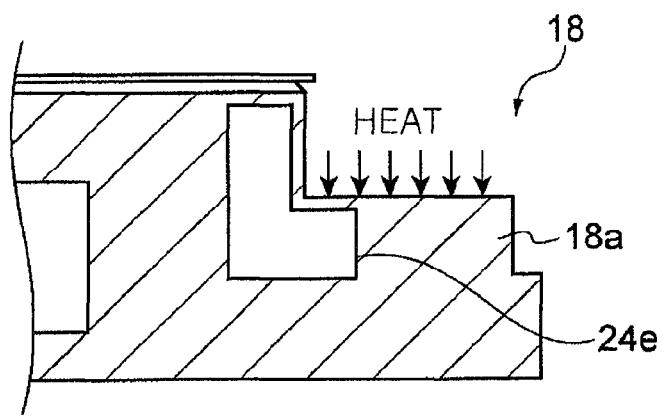
Figure 8:
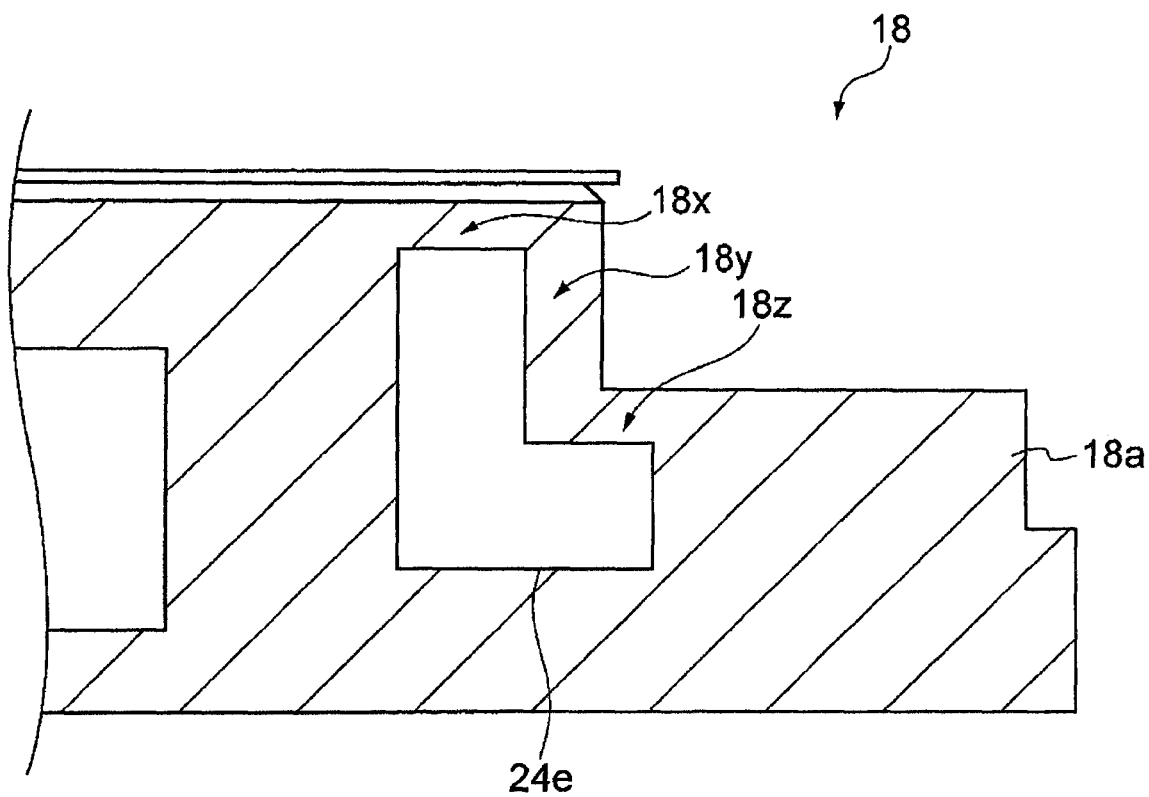
FIG. 8 shows insulating positions of the mounting table of the present embodiment.

First, the configuration used for the simulation will be described. FIGS. 7A to 7C show the peripheral path 24p in the conventional mounting table 180 and the peripheral path 24e in the mounting table 18 of the present embodiment. FIG. 7A shows the peripheral path 24p in the conventional mounting table 180, and FIGS. 7B and 7C show the substantially L-shaped peripheral path 24e of the present embodiment. Here, the peripheral path 24e shown in FIG. 7C is positioned closer to the first top surface 18u1, the second top surface 18u2 and the side surface 18s of the mounting table 18, compared to the peripheral path 24e shown in FIG. 7B. For example, the distance from the peripheral path 24e shown in FIG. 7B to the first top surface 18u1, the second top surface 18u2 and the side surface 18s of the mounting table 18 is shorter by about 2 mm than the distance from the peripheral path 24e shown in FIG. 7B thereto. FIG. 7B and FIG. 7C are different in the thickness of the insulating position. The insulating position insulates the heat input from the focus ring FR side. FIG. 8 shows the insulating position in the mounting table 18 of the present embodiment. As shown in FIG. 8, an insulating position 18x is between the first top surface 18u1 of the mounting table 18 and the peripheral path 24e; an insulating position 18y is between the side surface 18s of the mounting table 18 and the peripheral path 24e; and an insulating position 18z is between the second top surface 18u2 of the mounting table 180 and the peripheral path 24e. The thickness of each of the insulating positions 18x, 18y and 18z of the mounting table 18 shown in FIG. 7B may be smaller than or equal to 5 mm, as will be described later. Here, it is about 3 mm.

Figure 9:
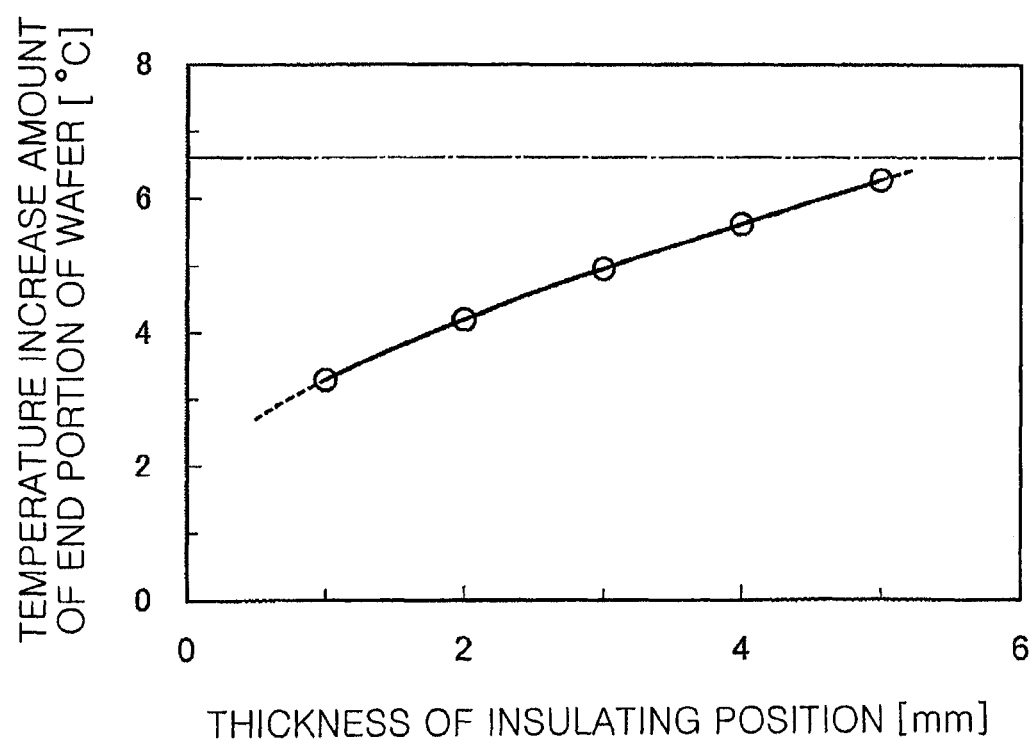
FIG. 9 is a graph showing an amount of temperature increase of the end portion of the wafer with respect to a thickness of an insulating position 18y.

FIG. 9 is a graph showing the amount of temperature increase of the end portion of the wafer W (the position spaced from the center (origin) of the wafer W by a distance of 150 mm) in accordance with the thickness of the insulating position 18y shown in FIG. 8. In FIG. 9, the horizontal axis indicates the thickness of the insulating position 18y, and the vertical axis indicates the amount of temperature increase of the end portion of the wafer W. The dashed dotted line indicates the amount of temperature increase of the end portion of the wafer W in the convention mounting table 180, i.e., about 6.6° C. As shown in FIG. 9, when the thickness of the insulating position 18y is smaller than or equal to 5 mm, the amount of temperature increase of the end portion of the wafer W is decreased compared to that in the case of the conventional mounting table 180. Accordingly, when the thickness of the insulating position 18y is smaller than or equal to 5 mm, the amount of temperature increase of the wafer W can be reduced. Further, it was found that the amount of temperature increase of the end portion of the wafer W was decreased by about 25% in the case where the thickness of the insulating position 18y was about 3 mm and decreased by about 50% in the case where the thickness of the insulating position 18y was about 1 mm, compared to the case of the conventional mounting table 180. Although it is not illustrated, the amount of temperature increase of the wafer W in accordance with the thickness of the insulating position 18x and the amount of temperature increase of the end portion of the wafer W in accordance with the thickness of the insulating position 18z are the same as those shown in FIG. 9. Therefore, the thicknesses of the insulating positions shown in FIG. 8 can be made smaller than or equal to 5 mm. In FIGS. 7B and 7C, the fin portion 25 of the peripheral path 24e of the present embodiment is omitted. Hereinafter, the simulation results of the case where heat was input only to the second top surface 18u2, the case where heat was input only to the wafer W, and the case of where heat was input to both the second top surface 18u2 and the wafer W by using the mounting tables having the peripheral path 24e of the present embodiment and the conventional peripheral path 24p shown in FIGS. 7A to 7C will be described.

Figure 10:
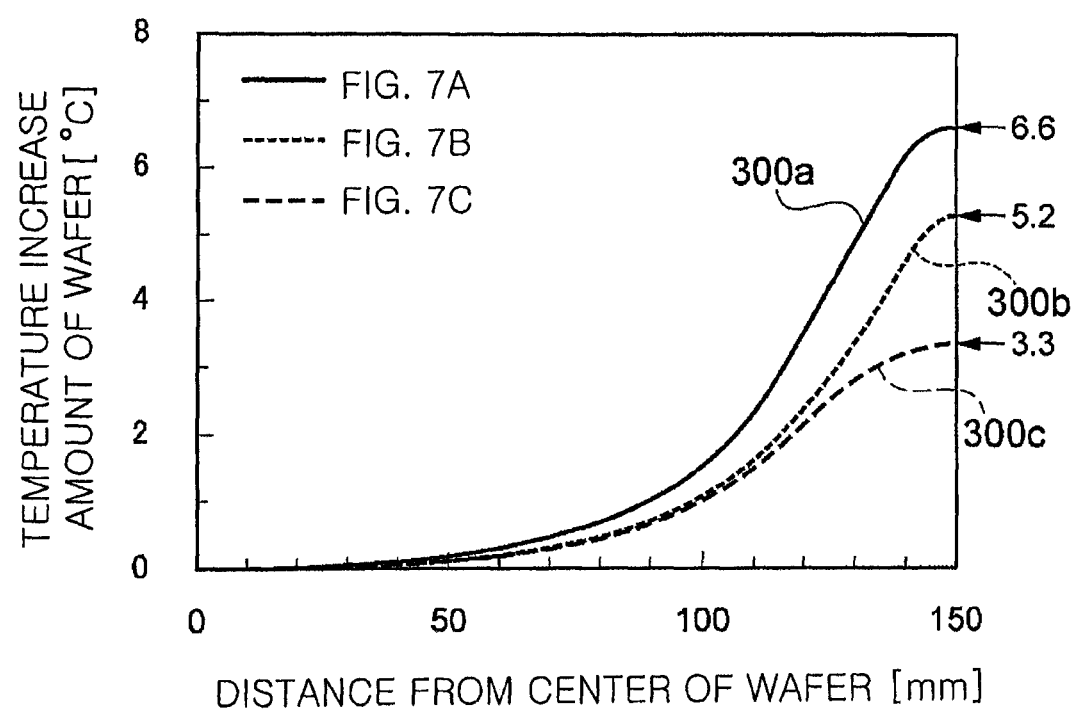
FIG. 10 is a graph showing temperature distribution of the wafer in the case where heat is input only from the focus ring without heat input to the wafer in the mounting tables having peripheral paths shown in FIGS. 7A to 7C.

First, the simulation result of the case where heat was input only to the second top surface 18u2 will be described. FIG. 10 is a graph showing temperature distribution of the wafer W in the case of inputting heat to the second top surface 18u2 without inputting heat to the wafer W in the mounting tables having the peripheral paths shown in FIGS. 7A to 7C. In FIG. 10, the horizontal axis indicates a distance from the center (origin) of the wafer W and the vertical axis indicates the amount of temperature increase of the wafer W. Here, the amount of temperature increase of the wafer W is a difference between the temperature of the surface of the wafer W and the temperature of the center (origin) of the wafer W on the mounting table 180 having the conventional peripheral path 24p shown in FIG. 7A. In FIG. 10, a graph 300a shows the amount of temperature increase in the case of using the mounting table 180 having the peripheral path 24p shown in FIG. 7A; a graph 300b shows the amount of temperature increase in the case of using the mounting table 180 having the substantially L-shaped peripheral path 24e shown in FIG. 7B; a graph 300c shows the amount of temperature increase in the case of using the mounting table 180 having the substantially L-shaped peripheral path 24e shown in FIG. 7C.

As shown in FIG. 10, the amount of temperature increase of the end portion of the wafer W (the position spaced from the center (origin) of the wafer W by a distance of 150 mm) in the case of using the mounting table 180 having the conventional peripheral path 24p shown in FIG. 7A was 6.6° C. On the other hand, the amount of temperature increase of the end portion of the wafer W in the case of using the mounting table 180 having the peripheral path 24e of the present embodiment shown in FIG. 7B was 5.2° C. In other words, when the mounting table 18 having the peripheral path 24e of the present embodiment was used, the amount of temperature increase of the wafer W was decreased by 1.4° C., compared to when the mounting table 180 having the conventional peripheral path 24p was used. This means that the effect of decreasing the temperature by about 21% was ensured compared to the case of using the mounting table 180 having the conventional peripheral path 24p.

Further, when the mounting table 18 having the peripheral path 24e shown in FIG. 7C was used, the amount of temperature increase of the end portion of the wafer W was 3.3° C. In other words, when the mounting table 18 having the peripheral path 24e of the present embodiment was used, the amount of temperature increase of the wafer W was decreased by 3.3° C., compared to when the mounting table 180 having the conventional peripheral path 24p was used. This means that the effect of decreasing the temperature by about 50% was ensured compared to the case of using the mounting table 180 having the conventional peripheral path 24p.

Figure 11:
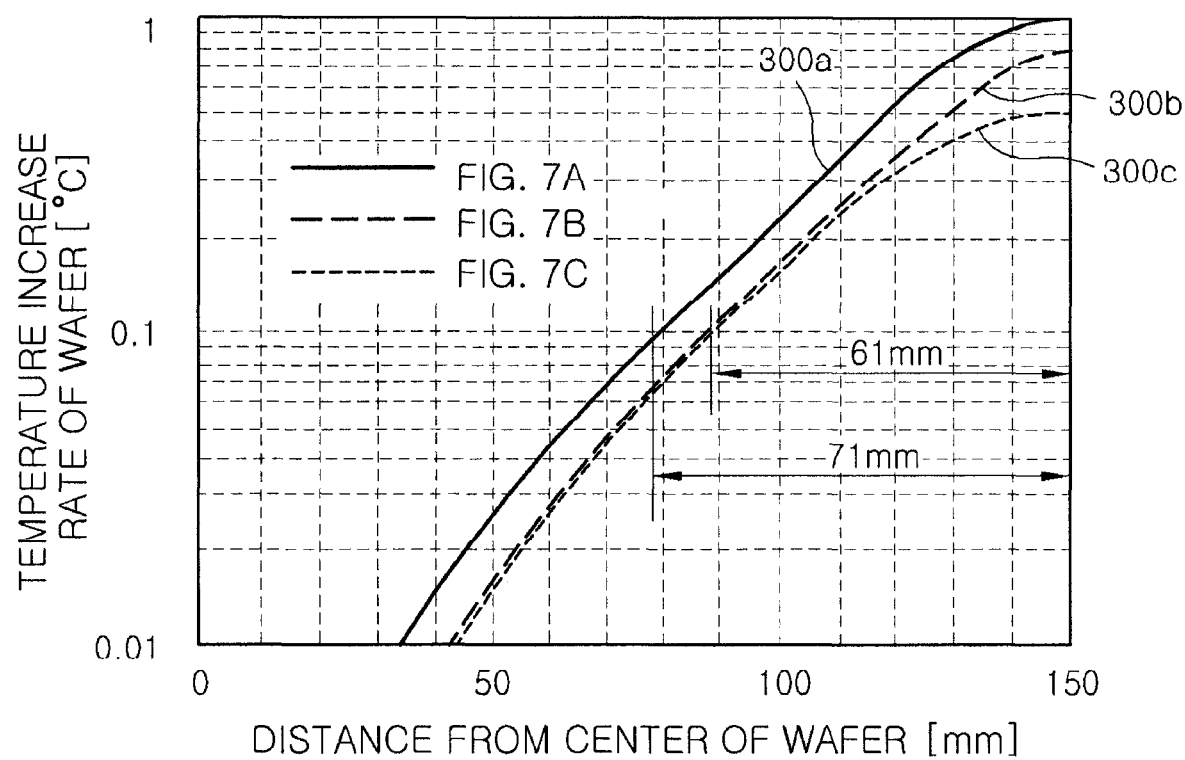
FIG. 11 is a graph in which the value of the vertical axis of FIG. 10 is normalized and indicated as a logarithmic scale.

FIG. 11 is a graph in which the values of the vertical axis of FIG. 10 are normalized and indicated as a logarithmic scale. FIG. 11 is a graph in which the vertical axis values of FIG. 10 are normalized as the temperature differences of the wafer W (hereinafter, referred to as "temperature increase rate") in the cases of using the mounting tables having the peripheral paths shown in FIGS. 7A to 7C. In FIG. 11, the graph 300a shows a temperature increase rate in the case of using the mounting table 180 having the peripheral path 24p shown in FIG. 7A. The graph 300b shows a temperature increase rate in the case of using the mounting table 18 having the substantially L-shaped peripheral path 24e shown in FIG. 7B. The graph 300c shows a temperature increase rate in the case of using the mounting table 18 having the substantially L-shaped peripheral path 24e shown in FIG. 7C. As shown in FIG. 11, when the mounting table 180 having the conventional peripheral path 24p shown in FIG. 7A was used, the region of the wafer W where the temperature increase rate was higher than 10% (the region where the temperature increase rate was higher than 0.1 in the vertical axis of the drawing) ranged from the end portion of the wafer W to the position spaced from the center by a distance of about 71 mm. In other words, it was the region spaced from the center (origin) of the wafer W by a distance of about 79 mm to 150 mm.

On the other hand, when the mounting table 18 having the peripheral path 24e shown in FIG. 7B was used, the region of the wafer W where the temperature increase rate was higher than 10% ranged from the end portion of the wafer W to the position spaced from the center by a distance of about 62 mm. In other words, it was the region spaced from the center (origin) of the wafer W by a distance of about 88 mm to 150 mm. From the above result, it was seen that when the mounting table 18 having the peripheral path 24e of the present embodiment shown in FIG. 7B was used, the region where the temperature increase rate with respect to the temperature of the center (origin) of the wafer was higher than 10% was reduced by about 13%, compared to when the mounting table 180 having the conventional peripheral path 24p was used.

Further, when the mounting table 18 having the peripheral path 24e of the present embodiment shown in FIG. 7C was used, the region where the temperature increase rate was higher than 10% ranged from the end portion of the wafer W to the position spaced from the center by a distance of about 60 mm. In other words, when the mounting table 18 having the peripheral path 24e of the present embodiment shown in FIG. 7C was used, the region where the temperature increase rate was higher than 10% was reduced by about 14% compared to when the mounting table 180 having the conventional peripheral path 24p was used. Moreover, 61 mm in FIG. 11 indicates the average between the region where the temperature increase ratio exceeds a 10% in the case of using the mounting table 18 of FIG. 7B and the region where the temperature increase ratio exceeds 10% in the case of using the mounting table 18 of FIG. 7C.

Accordingly, it has been found that when the mounting table 18 having the peripheral path 24e of the present embodiment is used, it is possible to obtain the effects of reducing the amount of temperature increase by the heat input to the second top surface 18u2, i.e., the heat input from the focus ring RF side, and reducing the region of the wafer W where the temperature is increased.

Figure 12A:
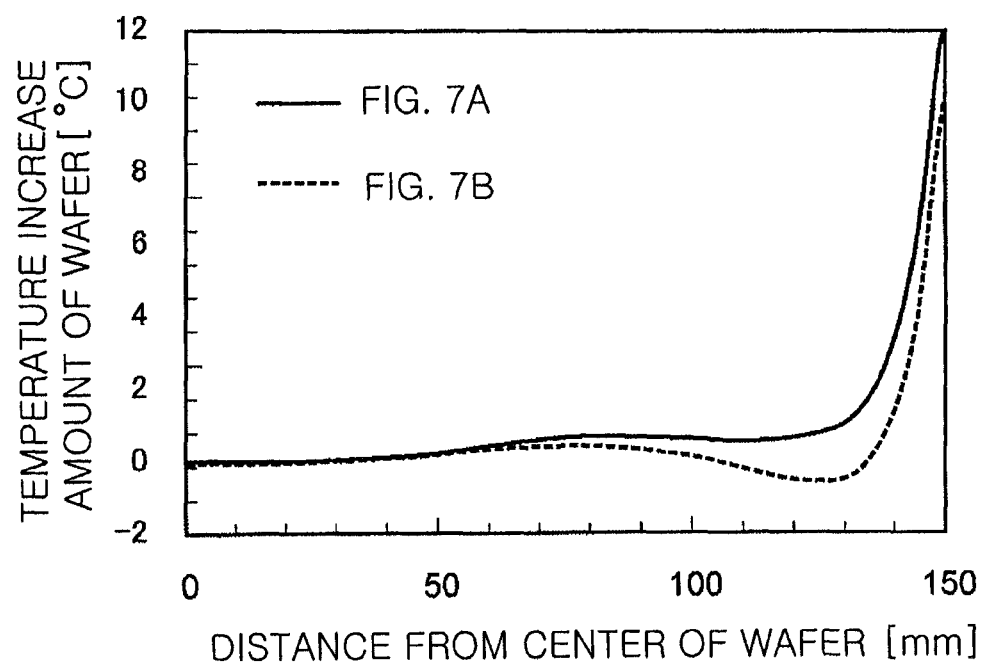
FIGS. 12A and 12B are graphs for comparing temperature distributions in the edge region of the wafer between the case of using the mounting table having the conventional peripheral path and the case of using the mounting table having the peripheral path of the present embodiment.
Figure 12B:
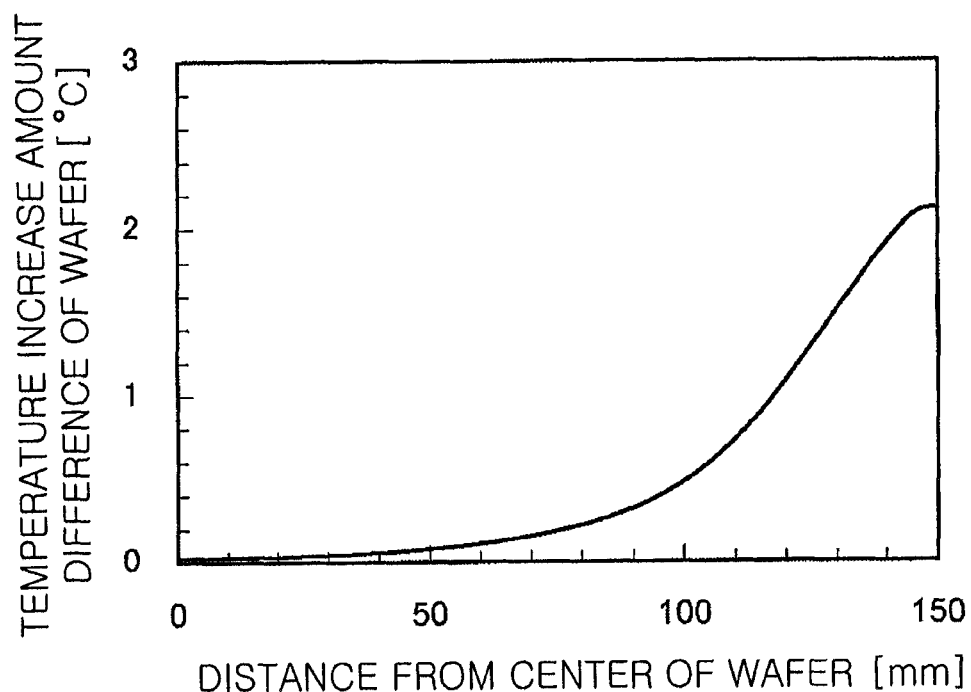

Next, the simulation result of the case where heat was input only to the wafer W will be described. FIGS. 12A and 12B are graphs for comparing temperature distributions in the edge region of the wafer W between the case of using the mounting table 180 having the conventional peripheral path 24p and the case of using the mounting table 18 having the peripheral path 24e of the present embodiment. In other words, the heat was input only to the wafer W without being input to the second top surface 18u2. FIG. 12A is a graph for comparing temperature distributions on the surface of the wafer W between the case of using the mounting table 180 having the conventional peripheral path 24p shown in FIG. 7A and the case of using the mounting table 18 having the peripheral path 24e of the present embodiment shown in FIG. 7B. In FIG. 12A, the horizontal axis indicates a distance from the center (origin) of the wafer W, and the vertical axis indicates the amount of temperature increase of the wafer W (the value obtained by subtracting, from the temperature of the surface of the wafer w, the temperature of the center (origin) of the wafer W in the mounting table 180 having the conventional peripheral path 24p shown in FIG. 7A). Further, the solid line is a graph in the case of using the mounting table 180 having the peripheral path 24p shown in FIG. 7A, and a dashed line is a graph in the case of using the mounting table 18 having the peripheral path 24e of the present embodiment shown in FIG. 7B. FIG. 12B is a graph showing the difference between the value indicated by the solid line and the value indicated by the dashed line in FIG. 12A. In FIG. 12B, the horizontal axis indicates a distance from the center (origin) of the wafer W, and the vertical axis indicates the difference between the temperature of the surface of the wafer w in the case of using the mounting table 180 having the conventional peripheral path 24p shown in FIG. 7A and the temperature of the surface of the wafer W in the case of using the mounting table 18 having the peripheral path 24e of the present embodiment shown in FIG. 7B. As shown in FIGS. 12A and 12B, when the mounting table 18 having the peripheral path 24e of the present embodiment shown in FIG. 7B was used, the amount of temperature increase of the wafer W was decreased by 2.1° C., compared to when the mounting table 180 having the conventional peripheral path 24p shown in FIG. 7A was used.

Figure 13:
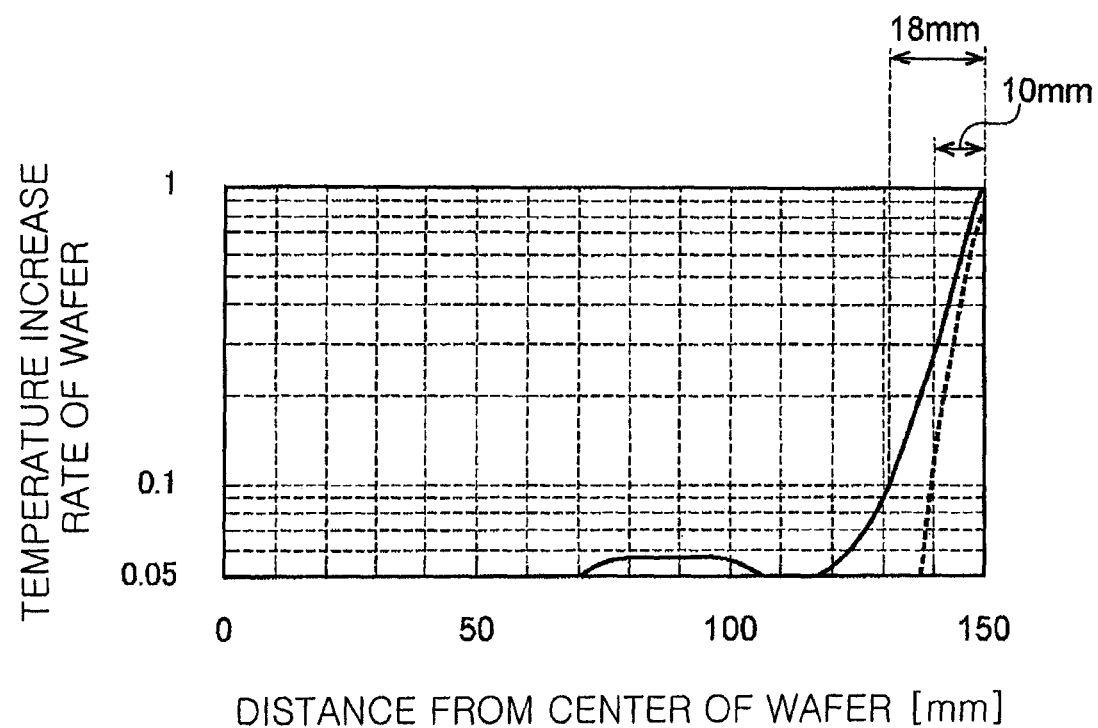
FIG. 13 is a graph in which values of the vertical axis of FIG. 10 is normalized.

FIG. 13 is a graph in which the values of the vertical axis of FIG. 12A are normalized. In other words, FIG. 13 is the graph in which the values of the vertical axis of FIG. 12A are indicated as the temperature increase rate. In FIG. 13, the solid line is a graph in the case of using the mounting table 180 having the peripheral path 24p shown in FIG. 7A, and the dashed line is a graph in the case of using the mounting table 18 having the peripheral path 24e of the present embodiment shown in FIG. 7B. As shown in FIG. 13, in the conventional peripheral path 24p of FIG. 7A, the region where the temperature increase rate was higher than a 10% (the region where the temperature increase rate was higher than 0.1 of the vertical axis in the drawing) ranged from the end portion of the wafer W to the position spaced from the center by a distance of about 18 mm. On the other hand, in the case of using the mounting table 18 having the peripheral path 24e of the present embodiment shown in FIG. 7B, the region where the temperature increase rate was higher than 10% ranged from the end portion of the wafer W to the position spaced from the center by a distance of about 10 mm. In other words, in the case of using the mounting table 18 having the peripheral path 24e of the present embodiment, the region where the temperature increase rate with respect to the temperature of the center (origin) of the wafer W was higher than 10% was reduced by about 45% compared to the case of using the conventional peripheral path 24p.

As described above, it has been found that when the mounting table 18 having the peripheral path 24e of the present embodiment is used, it is possible to obtain the effects of decreasing the amount of temperature increase by the heat input to the wafer W and reducing the region of the wafer W where the temperature is increased.

Figure 14:
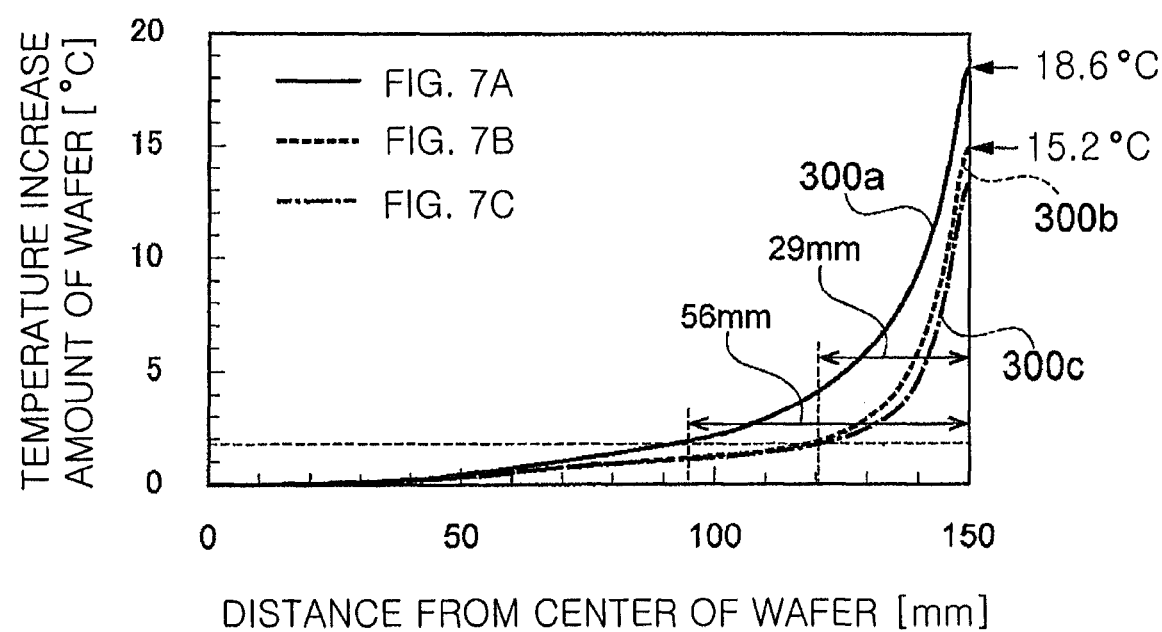
FIG. 14 is a graph showing temperature distribution of the wafer in the case where the heat input from the focus ring and the heat input to the wafer occur in the mounting tables having the peripheral paths shown in FIGS. 7A to 7C.

Next, the case of inputting heat to the second top surface 18u2 and the wafer W will be described. FIG. 14 is a graph showing temperature distributions of the wafer W in the case of inputting heat to the second top surface 18u2 and the wafer W in the mounting tables having the peripheral paths shown in FIGS. 7A to 7C. In FIG. 14, the horizontal axis indicates a distance from the center (origin) of the wafer W, and the vertical axis indicates the amount of temperature increase of the wafer W (the value obtained by subtracting, from the temperature of the surface of the wafer W, the temperature of the center (origin) of the wafer W having the conventional peripheral path 24p shown in FIG. 7A). Further, the graph 300a shows the amount of temperature increase in the case of using the mounting table 180 having the conventional peripheral path 24p shown in FIG. 7A; the graph 300b shows the amount of temperature increase in the case of using the mounting table 18 having the peripheral path 24e of the present embodiment shown in FIG. 7B; and the graph 300c shows the amount of temperature increase in the case of using the mounting table 18 having the peripheral path 24e of the present embodiment shown in FIG. 7C.

As shown in FIG. 14, in the case of using the mounting table 180 having the conventional peripheral path 24p shown in FIG. 7A, the amount of temperature increase in the end portion of the wafer W was 18.6° C. Meanwhile, in the case of using the mounting table 18 having the peripheral path 24e of the present embodiment shown in FIG. 7B, the amount of temperature increase in the end portion of the wafer W was 15.2° C., which was reduced by 3.4° C. compared to the conventional peripheral path 24p (about 18%). Further, in the case of using the mounting table 18 having the peripheral path 24e of the present embodiment shown in FIG. 7C, the amount of temperature increase in the end portion of the wafer W was 13.4° C., which was reduced by 5.2° C. (about 28%) compared to the case of using the mounting table 180 having the conventional peripheral path 24p.

Moreover, as shown in FIG. 14, in the case of using the mounting table 180 having the conventional peripheral path 24p shown in FIG. 7A, the region of the wafer W where the temperature increase rate was higher than 10% ranged from the end portion of the wafer W to the position spaced from the center by a distance of about 56 mm. On the other hand, in the case of using the mounting table 18 having the peripheral path 24e of the present embodiment shown in FIG. 7B, the region of the wafer W where the temperature increase rate was higher than 10% ranged from the end portion of the wafer W to the position spaced from the center by a distance of about 30 mm. In other words, in the case of using the mounting table 18 having the peripheral path 24e of the present embodiment shown in FIG. 7B, the region where the temperature increase rate was higher than 10% was reduced by about 46% compared to the case of using the mounting table 180 having the conventional peripheral path 24p. Further, in the case of using the mounting table 18 having the peripheral path 24e of the present embodiment shown in FIG. 7C, the region of the wafer W where temperature increase rate was higher than 10% ranged from the end portion of the wafer W to the position spaced from the center by a distance of about 28 mm. In other words, in the case of using the mounting table 18 having the peripheral path 24e shown in FIG. 7C, the region where the temperature increase rate was higher than 10% was reduced by about 50% compared to the case of using the mounting table 180 having the peripheral path 24p. Further, 29 mm in FIG. 14 indicates the average between the region where the temperature increase rate was higher than 10% in the case of using the mounting table 18 shown in FIG. 7B and the region where the temperature increase rate was higher than 10% in the case of using the mounting table 18 shown in FIG. 7C.

As described above, it has been found that when the mounting table 18 having the peripheral path 24e of the present embodiment is used, even if the heat is input to the wafer W, it is possible to obtain the effects of decreasing the amount of temperature increase by the heat input from the focus ring FR and reducing the region of the wafer W where the temperature is increased. As for a method for improving non-uniform temperature distribution of the wafer W caused by the heat input from the focus ring RF, there may be employed a method for preventing transfer of the heat input from the focus ring FR side by providing a portion of the mounting table which faces the focus ring RF side separately from the mounting table main body. However, when the separate structure is employed, it is required to provide a unit for cooling the portion of the mounting table which faces the focus ring FR side. Further, an insulating layer may be inserted between the focus ring FR and the second top surface 18u2. In that case, however, the temperature cannot be controlled. Besides, a coolant path may be formed directly below the focus ring FR. In that case, however, it is difficult to provide a unique structure for the focus ring FR directly below the focus ring FR. When the mounting table 18 having the peripheral path 24e of the present embodiment is used, the above-described problems cannot be solved.

(Second Cause)

Figure 15:
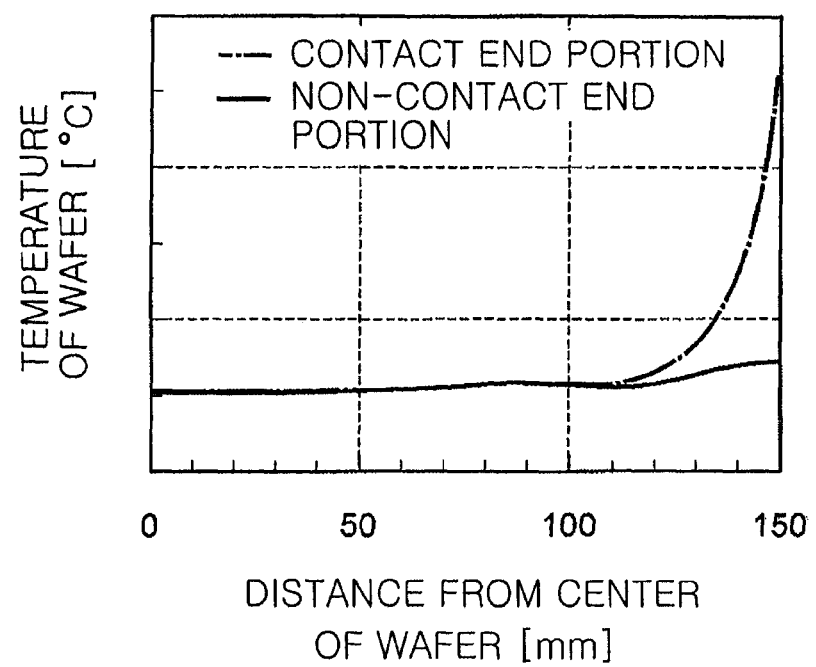
FIG. 15 is a graph for comparing a temperature of the wafer in the case where the end portion of the wafer is not in contact with the mounting surface of the mounting table and a temperature of the wafer in the case where the end portion of the wafer is in contact with the mounting surface of the mounting table.

Next, the simulation result of temperature distribution due to the second cause will be described. FIG. 15 is a graph for comparing the temperature of the wafer W in the case where the end portion of the wafer W is in contact with the mounting surface 19 of the mounting table 180 with the temperature of the wafer W in the case where the end portion of the wafer W is not in contact with the mounting surface 19 of the mounting table 180. In FIG. 15, the horizontal axis indicates a distance from the center (origin) of the wafer W, and the vertical axis indicates a temperature of the wafer W. Further, the solid line is a graph showing the temperature distribution in the case where the end portion of the wafer W is in contact with the mounting surface 19 of the mounting table 180, and the dashed dotted line is a graph showing the temperature distribution in the case where the end portion of the wafer W is not in contact with the mounting surface 19 of the mounting table 180. As shown in FIG. 15, when the end portion of the wafer W is in contact with the mounting surface 19 of the mounting table 180, the temperature of the end portion of the wafer W is not increased. However, when the end portion of the wafer W is not in contact with the mounting surface 19 of the mounting table 180, the temperature of the end portion of the wafer W was increased. In other words, it was clear that, in the conventional mounting table 180, the temperature of the end portion of the wafer W was increased because the end portion of the wafer W was not in contact with the mounting surface 19 of the mounting table 180. The above-described result shows that the temperature control is greatly affected by the contact area between the wafer W and the mounting table.

Operations and Effects of the Mounting Table 18 of the Present Embodiment

Next, the operations and effects of the plasma processing apparatus 10 and the mounting table 18 of the present embodiment will be described by using the simulation result.

Figure 16:
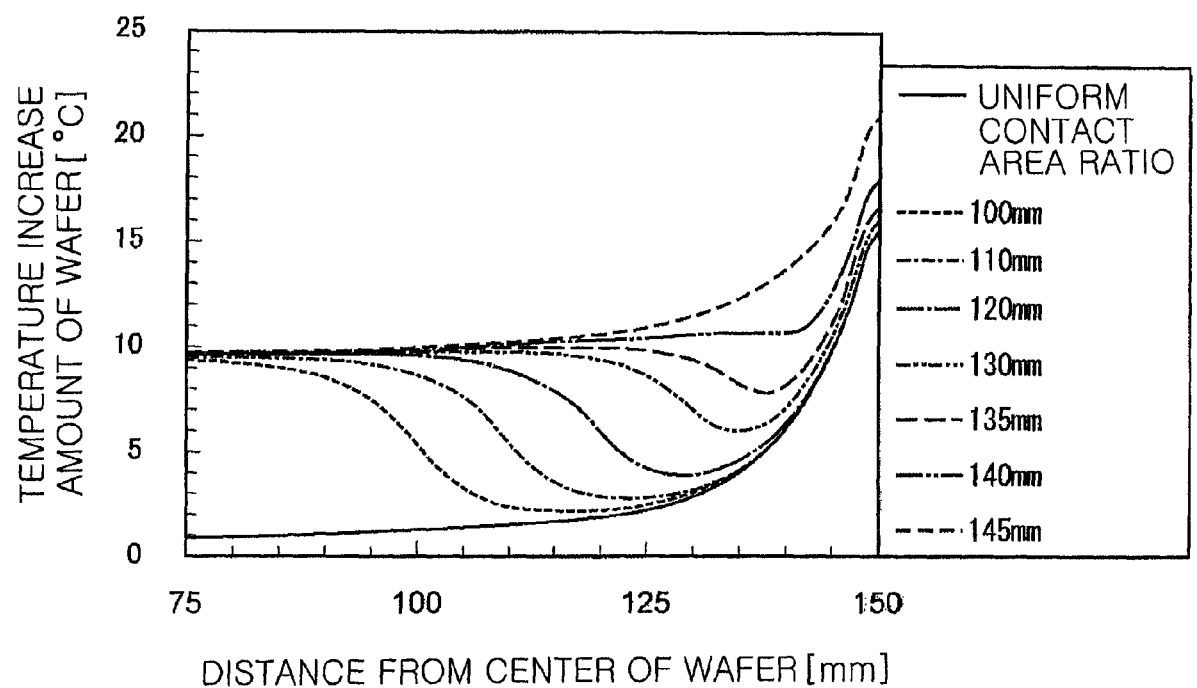
FIG. 16 is a graph showing temperature distribution of the wafer in the case of varying boundary positions in the mounting table having the peripheral path of the present embodiment shown in FIG. 7B.

The case of using the mounting table 18 in which the contact area ratio of the central region 19c of the mounting surface 19 was about 3% and that of the peripheral region 19e of the mounting surface 19 was about 15% was simulated as an example. Here, the temperature distributions of the wafer W in the case of using a plurality of mounting tables 18 having different boundary positions between the central region 19c and the peripheral region 19e of the mounting surface 19 was simulated. The result thereof is shown in FIG. 16. In FIG. 16, the horizontal axis indicates a distance from the center (origin) of the wafer W, and the vertical axis indicates the amount of temperature increase of the wafer W. The amount of temperature increase of the wafer W shown in FIG. 16 is obtained by simulating the case where the boundary position between the central region 19c and the peripheral region 19e of the mounting surface 19 (hereinafter, referred to as "boundary position $r_{C/E}$") is positioned in a region spaced from the center (origin) of the wafer W by a distance of 100 mm to 145 mm. FIG. 17 is a table showing a decrease rate of variation $\Delta T$ of the temperature distribution in accordance with the boundary position between the central region 19c and the peripheral region 19e of the mounting surface 19. Here, the variation $\Delta T$ of the temperature distribution is the difference between a minimum value and a maximum value of the amount of temperature increase of the wafer W at the respective boundary positions $r_{C/E}$. Further, the uniform contact area ratio indicates the case where the contact area ratio is uniform over the entire surface of the mounting surface 19. Here, the contact area ratio of the entire surface of the mounting surface 19 was 15%.

As shown in FIGS. 16 and 17, in the boundary position $r_{C/E}$ where the distance from the center (origin) of the wafer W was greater 110 mm, the variation of the temperature distribution was reduced by 15% or above compared to the case where the contact area ratio was uniform. Therefore, it was clear that when the contact area ratio in a region inward of a position spaced from the end of the wafer W by a distance of 40 mm or less was reduced, the variation $\Delta T$ of the temperature distribution was reduced by 15% or above compared to the case where the contact area ratio was uniform. In the boundary position $r_{C/E}$ where the distance from the center of the wafer W was in a region of 120 mm to 145 mm, the variation was reduced by 20% or above. In the boundary position $r_{C/E}$ where the distance from the center of the wafer W was in a region of 135 mm to 140 mm, the variation was reduced by 40% or above.

The numerical ranges of the contact area ratio of the central region 19c (hereinafter, referred to as "contact area ratio $S_C$") and the contact area ratio of the peripheral region 19e (hereinafter, referred to as "contact area ratio $S_E$") in which the variation $\Delta T$ of the temperature distribution can be effectively reduced are changed in accordance with He pressures. The heat resistance between the wafer W and the mounting surface 19 is determined by heat transfer by He gas and heat transfer by solid contact with the mounting surface 19. At a high He pressure (50 Torr ($6.66 \times 10^3$ Pa) in an assumed He pressure range (about 10 to 50 Torr: about $1.33 \times 10^3$ to $6.66 \times 10^3$ Pa), compared to at a low He pressure, if a large difference between the contact area ratio $S_C$ and the contact area ratio $S_E$ is not ensured, a proper difference between the heat resistance of the central region 19c and the heat resistance of the peripheral region 19e cannot be ensured. In other words, a maximum difference between the contact area ratio $S_C$ and the contact area ratio $S_E$ which can ensure a proper difference between the heat resistance of the central region 19c and the heat resistance of the peripheral region 19e can be determined under the high He pressure condition. On the other hand, at a low He pressure, even if the difference between the contact area ratio $S_C$ of the central region 9c and the contact area ratio $S_E$ of the peripheral region 19e is small, a proper difference between the heat resistance of the central region 19c and the heat resistance of the peripheral region 19e can be ensured. In other words, a minimum difference between the contact area ratio $S_C$ and the contact area ratio $S_E$ which can ensure a proper difference between the heat resistance of the central region 19c and the heat resistance of the peripheral region 19e can be determined under the low He pressure condition. Further, the case where the difference between the contact area ratio $S_C$ and the contact area ratio $S_E$ is zero indicates the case where the contact area ratio is uniform over the entire the mounting surface 19.

Figure 18:
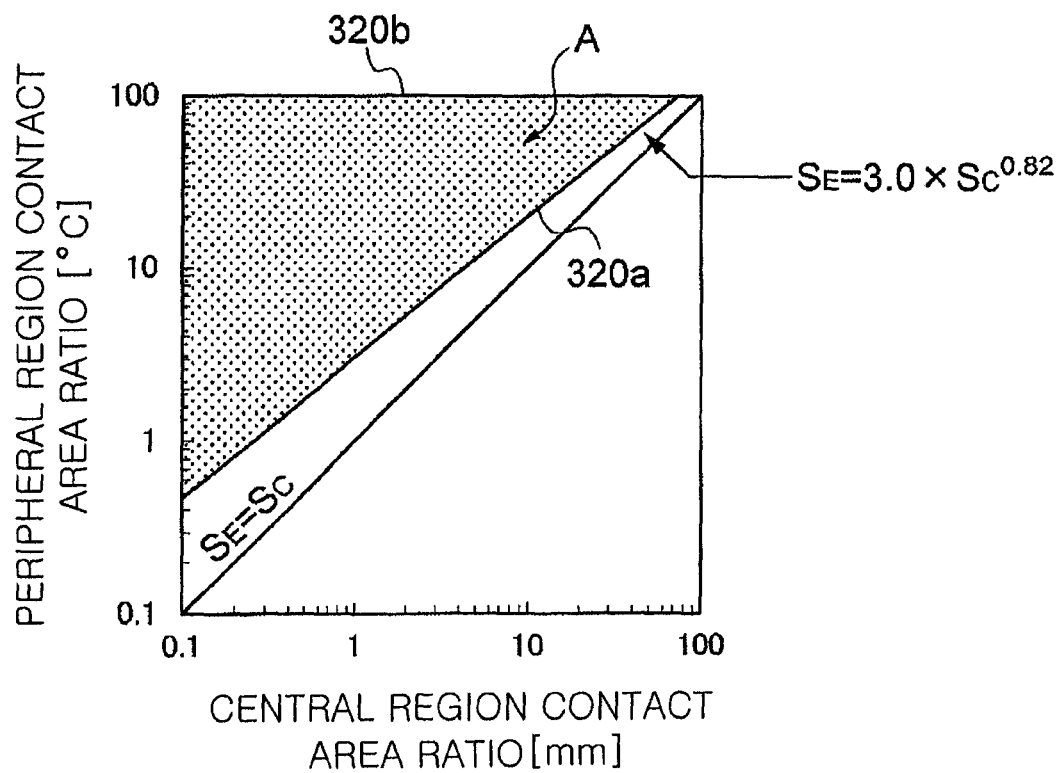
FIG. 18 shows a region having a maximum contact area ratio where the variation ΔT of the temperature distribution can be effectively decreased.

Based on the above conclusion, the contact area ratio capable of improving the variation $\Delta T$ of the temperature distribution compared to the case where the contact area ratios $S_C$ and $S_E$ are uniform was simulated in the cases of the high He pressure and the low He pressure. The results thereof are shown in FIG. 18. FIG. 18 shows regions where the contact area ratios $S_C$ and $S_E$ capable of effectively reducing the variation $\Delta T$ of the temperature distribution are maximum. As shown in FIG. 18, in a region A specified by a minimum line 320a, a maximum line 320b and the coordinate axis, the variation $\Delta T$ of the temperature distribution can be reduced by 15% or above by controlling the He pressure, compared to the case where the contact area ratios $S_C$ and $S_E$ are uniform. Here, the minimum line 320a is obtained under the conditions in which the He pressure is low, the width of the end portion of the wafer W which is not in contact with the mounting surface 19 is 1.8 mm and the boundary position $r_{C/E}$ is spaced from the center (origin) of the wafer W by a distance of 110 mm, and is expressed by the following Eq. (1).

$$S_E = 3.0 \times S_C^{0.82} \quad \text{Eq. (1):}$$

Meanwhile, the maximum line 320b is obtained under the conditions in which the He pressure is high, the width of the end portion of the wafer W which is not in contact with the mounting surface 19 is 2.8 mm, and the boundary position $r_{C/E}$ is spaced from the center (origin) of the wafer W by a distance of 144.2 mm.

In the mounting table 18 and the plasma processing apparatus 10 of the present embodiment, the peripheral path 24e formed in the mounting table 18 has a portion extending along the side surface 18s of the mounting table 18 toward the first top surface 18u1. Therefore, the capacity of the coolant path 24 which extracts the heat input to the inner side surface 18s of the mounting table 18 is improved. Accordingly, the heat from the focus ring FR is not easily transferred to the wafer W. As a consequence, the temperature increase of the edge region of the wafer W can be suppressed. Further, in this mounting table 18, a plurality of protrusions 19d is formed in a dot shape on the mounting surface 19 of the electrostatic chuck 18b, and the contact area between the protrusions 19d and the backside of the wafer W per unit area is greater in the peripheral region 19e than in the central region 19c. Accordingly, the heat resistance is greater in the central region 19c than in the peripheral region 19e. As a result, the heat transfer in the central region 19c is poor compared to that in the peripheral region 19e. The heat of the wafer W is transferred through the protrusions 19d, the mounting table 18 and the coolant path 24 in that order to be extracted. Therefore, the capacity of extracting heat from the wafer W (the wafer cooling capacity) is poorer in the central region 19c that in the peripheral region 19e. In other words, the wafer cooling capacity in the central region 19c of the mounting surface 19 can be reduced, and the temperature of the central region of the wafer W can be increased up to the temperature of the edge region of the wafer W. Accordingly, the temperature of the wafer W can be controlled by the coolant flowing in the coolant path 24 and the protrusions 19d, and the non-uniform temperature distribution between the central region and the edge region of the wafer W can be suppressed.

In the mounting table 18 of the present embodiment, the protrusions 19d have the same shape and the same size. Further, the number of the protrusions 19d of the peripheral region per unit area is larger than the number of the protrusions 19d of the central region 19c per unit area. Therefore, the wafer cooling capacity in the central region 19c of the mounting surface 19 can be decreased, and the temperature of the central region of the wafer W can be increased up to the temperature of the edge region of the wafer W.

Further, in the mounting table 18 of the present embodiment, the fin portion 25 extending from the upper and toward the lower end of the peripheral path 24e along the side surface 18s is formed at the upper end of the peripheral path 24e. Since the fin portion 25 is formed at the part of the peripheral path 24e, the surface area of the peripheral path 24e becomes greater than the surface area of the conventional peripheral path 24p. As a result, the heat extraction capacity of the coolant path 24 for extracting heat from the edge region of the wafer W can be improved, and the non-uniform temperature distribution between the central region and the edge region of the wafer W can be suppressed.

In the mounting table 18 of the present embodiment, a minimum distance D2 between the upper end of the peripheral path 24e and the first top surface 18u1 is smaller than a minimum distance D1 between the upper end of the central path 24c and the first top surface 18u1. Accordingly, the peripheral path 24e is positioned closer to the first top surface 18u1 of the base portion 18a compared to the central path 24c. As a result, the heat extraction capacity of the peripheral path 24e can be increased compared to that of the central path 24c, and the non-uniform temperature distribution between the central region and the edge region of the wafer W can be further suppressed.

In the mounting table 18 of the present embodiment, the mounting surface 19 has the lifter pin holes 200 through which the lifter pins 61 for supporting the wafer W penetrate, and the gap D4 between the protrusions 19d is larger than the diameter D3 of the lifter pin holes 200. Accordingly, the protrusions 19d can be formed without being affected by the locations of the lifter pin holes 200. As a result, the temperature of the wafer W can be controlled without being affected by the locations of the lifter pin holes 200.

While the invention has been shown and described with respect to the embodiments, various changes and modification may be made without departing from the scope of the invention as defined in the following claims.

Figure 19:
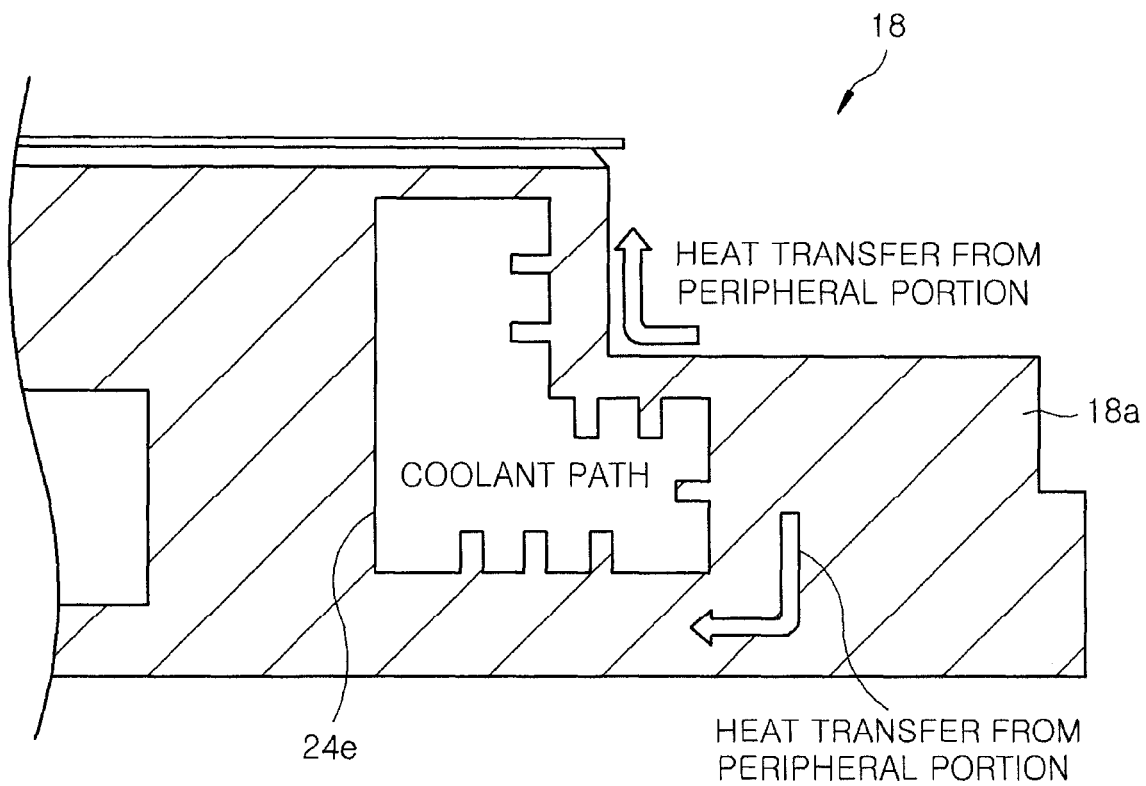
FIG. 19 shows a shape of a peripheral path of a mounting table as a modification of the mounting table of the present embodiment.

For example, the fin portion 25 may not be provided at the upper end of the peripheral path 24e, and other-shaped portion may be formed instead of the fin portion 25. FIG. 19 shows a shape of a peripheral path 24e of a mounting table as a modification of the mounting table 18 of the present embodiment. As shown in FIG. 19, the entire surface of the outer side surface of the peripheral path 24e may have an irregular shape to facilitate the heat transfer.

Further, a coolant circulating in the outermost peripheral path 24e may be supplied from a chiller unit different from the chiller unit used for the central path 24c. In that case, the temperature of the coolant in the peripheral path 24e can be controlled independently from the temperature of the coolant in the central path 24c.

The protrusions 19d may have different shapes or different sizes.

As for the plasma processing apparatus, it is possible to use a microwave plasma processing apparatus for generating plasma by using a microwave.

Test Example

Hereinafter, test examples and comparative examples that have been implemented by the present inventors will be described to explain the above-described effects. However, the present invention is not limited to the following test examples.

(Cooling Effect of the Coolant Path Having the Fin Portion)

In the mounting table of the plasma processing apparatus, the plasma processing was performed by using a mounting table including a path having a fin portion formed at the upper end of the peripheral path and a mounting table including a path having no fin portion, and a temperature of the wafer was measured. The processing conditions are as follows.

(Processing Conditions 1)
Pressure in the processing space S: 20 mTorr (2.67 Pa)
Power for plasma generation: 8300 W Processing gas flow rate: 500 sccm (Processing gas mainly including Ar)

Processing time: 120 sec

He pressure: 40 Torr ($5.33 \times 10^3$ Pa)

Figure 20:
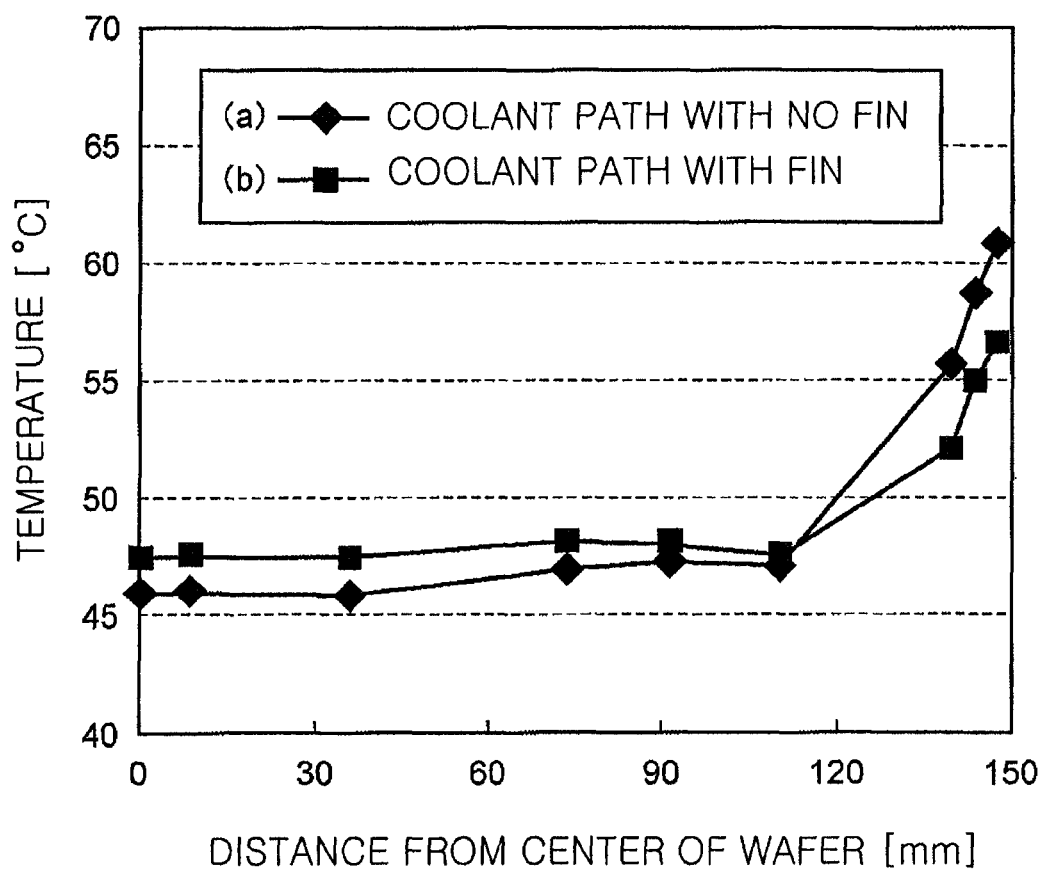
FIG. 20 is a graph showing relationship between a temperature of the wafer and a distance from a center of a wafer in the case of performing plasma processing under a processing condition 1.

FIG. 20 shows the measurement result of the temperature of the wafer W that has been subjected to the plasma processing under the processing conditions 1. FIG. 20 is a graph showing relationship between the temperature of the wafer and the distance from the center of the wafer in the case of performing the plasma processing under the processing conditions 1. The horizontal axis indicates the distance from the center (origin) of the wafer, and the vertical axis indicates the temperature of the wafer. The graph (a) in FIG. 20 shows the result obtained by using the mounting table including the coolant path having no fin portion. The graph (b) in FIG. 20 shows the result obtained by using the mounting table including the coolant path having the fin portion. As the graph (a) in FIG. 20, in the mounting table including the coolant path having no fin portion, the temperature of the end portion (147 mm) of the wafer was increased by about 15.2° C. compared to the average temperature of the central region (0 to 110 mm) of the wafer. Meanwhile, as the graph (b) in FIG. 20, in the mounting table including the coolant path having the fin portion, the temperature of the end portion (147 mm) of the wafer was increased by about 9.3° C. compared to the average temperature of the central region (0 to 110 mm) of the wafer. From the above, it is clear that the mounting table including the coolant path having the fin portion can suppress the temperature increase of the edge region of the wafer compared to the mounting table including the coolant path having no fin portion.

(Relationship Between the Contact Area Ratio and the Temperature)

In the mounting table of the plasma processing apparatus, the plasma processing was performed while varying the ratio (hereinafter, referred to as "contact area ratio") between the area where the protrusions formed on the mounting surface of the electrostatic chuck contact with the backside of the wafer and the area where the protrusions do not contact with the backside of the wafer, and the temperature of the wafer was measured. The He pressure was set to 40 Torr, 20 Torr and 10 Torr ($5.33 \times 10^3$ Pa, $2.67 \times 10^3$ Pa and $1.33 \times 10^3$ Pa). Other processing conditions are as follows.

(Processing Condition 2)

Pressure in the processing space S: 20 mTorr (2.67 Pa)

Power for plasma generation: 8300 W

Processing gas flow rate: 500 sccm (Processing gas mainly including Ar)

Processing time: 120 sec

Figure 21:
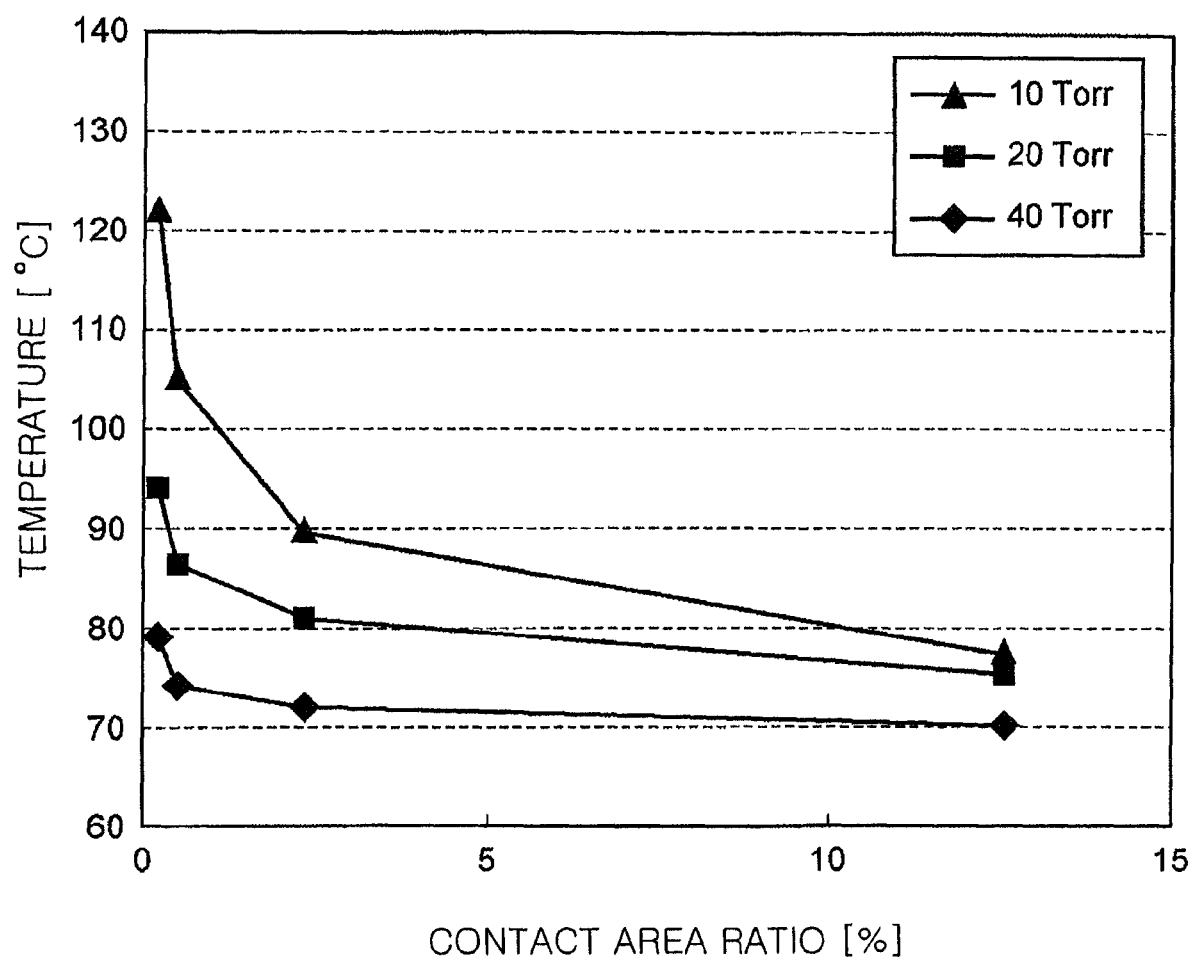
FIG. 21 is a graph showing relationship between a temperature of the wafer and a contact area ratio of a mounting table at different He pressures in the case of performing plasma processing under a processing condition 2.

FIG. 21 shows the measurement result of the temperature of the wafer W that has been subjected to the plasma processing under the processing conditions 2. FIG. 21 is a graph showing relationship between the temperature of the wafer and the contact area ratio of the mounting surface at different He pressures. The horizontal axis indicates the contact area ratio of the mounting surface, and the vertical axis indicates the temperature of the wafer. As shown in FIG. 21, the temperature of the wafer was decreased as the contact area ratio was increased, and the temperature of the wafer was increased as the contact area ratio was decreased. Therefore, it has been found that the wafer cooling capacity can be decreased by reducing the contact area ratio of the mounting surface. Further, it has been found that the amount of temperature increase of the wafer in the area having the smallest contact area ratio is increased as the He pressure is decreased. Accordingly, it is clear that the effect of the decrease in the contact area ratio on the wafer temperature control is increased as the He pressure is decreased.

(Effect of Obtaining Uniform Temperature Distribution by Combination of the Coolant Path Having the Fin Portion and Different Contact Area Ratios)

In the test examples 1 to 3, the plasma processing was performed by using a mounting table including a path having a fin portion and a mounting surface whose contact area ratio is reduced, and the temperature of the wafer was measured. In the comparative example 1, the plasma processing was performed by using a mounting table including a path having no fin portion and a mounting surface whose contact area ratio is the same as that of the conventional mounting table, and the temperature of the wafer was measured. In the test examples 1 to 3, the He pressure was set to 40 Torr, 30 Torr, 20 Torr and 10 Torr ($5.33 \times 10^3$ Pa, $4.00 \times 10^3$ Pa, $2.67 \times 10^3$ Pa and $1.33 \times 10^3$ Pa). In the comparative example 1, the He pressure was set to 40 Torr, 20 Torr and 10 Torr ($5.33 \times 10^3$ Pa, $2.67 \times 10^3$ Pa and $1.33 \times 10^3$ Pa). Other processing conditions are as follows. Hereinafter, the contact area ratio is obtained on the assumption that a reference area (unit area) is 100 $mm^2$.

(Processing Condition 3)

Pressure in the processing space S: 20 mTorr (2.67 Pa)

Power for plasma generation: 8300 W

Processing gas flow rate: 500 sccm (Processing gas mainly including Ar)

Processing time: 120 sec

Figure 22A:
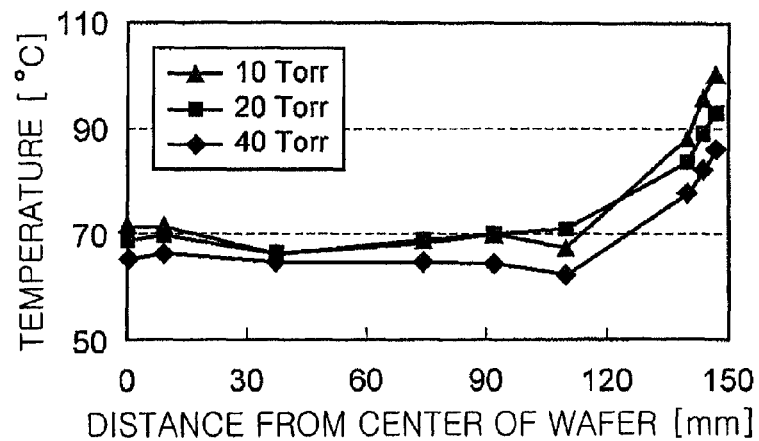
FIGS. 22A to 22C are graphs showing relationship between a temperature of the wafer and a distance from the center of the wafer at different He pressures in test examples 1 and 2 and a comparative example.
Figure 22B:
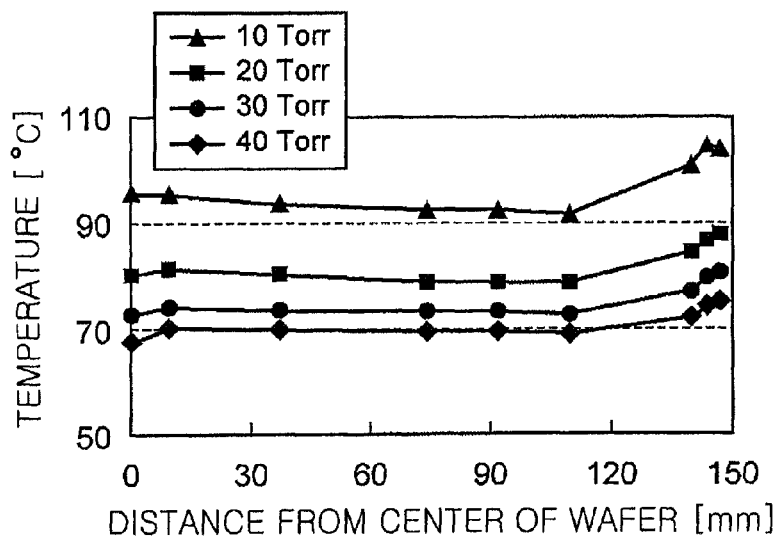
Figure 22C:
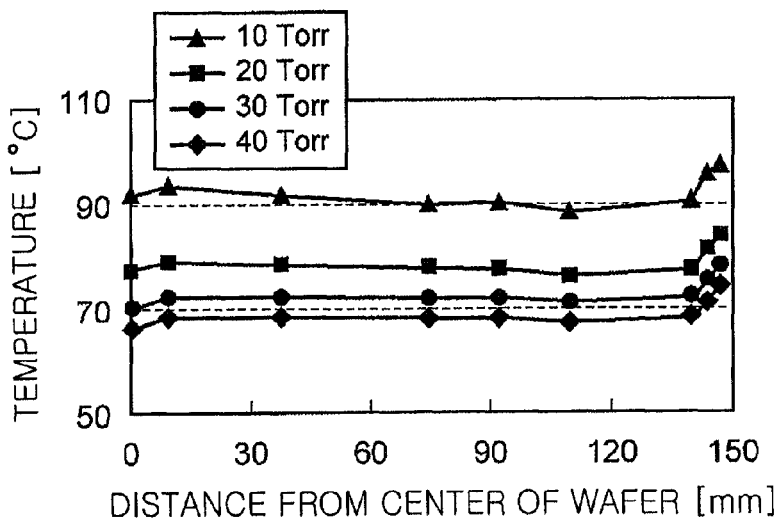

FIGS. 22A to 22C show test results of the test examples 1 to 3 and the comparative example 1 in which the plasma processing was performed under the processing condition 3 and the temperature of the wafer was measured. FIGS. 22A to 22C are graphs showing relationship between the temperature of the wafer and the distance from the center of the wafer W at different He pressures in the test examples 1 to 3 and the comparative example 1. The horizontal axis indicates the distance from the center (origin) of the wafer, and the vertical axis indicates the temperature of the wafer. FIG. 22A shows the measurement result of the comparative example 1 using the mounting table including the coolant path having no fin portion and the mounting surface whose contact area ratio per unit area is 17%. FIGS. 22B and 22C show the measurement results of the test examples 1 and 2 using the mounting table including the coolant path having the fin portion and the mounting surface whose contact area ratio is smaller than that of the comparative example 1. More specifically, FIG. 22B shows the measurement result of the test example 1 using the mounting table in which the contact surface per unit area in the entire region of the mounting surface is about 3%. FIG. 22C shows the measurement result of the test example 2 using a mounting table in which a contact area ratio per unit area in a central region of a mounting surface, i.e., a circular region (e.g., 0 to 140 mm when the diameter of the mounting surface is 300 mm) having the center of the mounting surface as an origin and a radius that is a distance from the center of the mounting surface to a position spaced from the outer peripheral end by a distance of 10 mm is 3% and in which a contact area ratio per unit area in a peripheral region, i.e., a region obtained by subtracting the central region from the circular region (e.g., 140 to 146 mm when the diameter of the mounting surface is 300 mm) is 17%.

As shown in FIG. 22A, in the comparative example 1, when the He pressure was 10 Torr, the temperature difference of the wafer in the region spaced from the center of the wafer by a distance of 0 to 147 mm was 33.6° C. In the same manner, in the comparative example 1, when the He pressures were 20 Torr and 40 Torr, the temperature differences of the wafer in the region spaced from the center of the wafer W by a distance of 0 to 147 mm were 26.0° C. and 23.9° C., respectively. The average temperature of the wafer was increased as the He pressure was decreased. However, the difference was not considerable, and the graphs were substantially overlapped.

As shown in FIG. 22B, in the test example 1, when the He pressure was 10 Torr, the temperature difference of the wafer in the region spaced from the center of the wafer by the distance of 0 to 147 mm was 12.6° C. In the same manner, in the test example 1, when the He pressures were 20 Torr, 30 Torr and 40 Torr, the temperature differences of the wafer in the region spaced from the center of the wafer by the distance of 0 to 147 mm were 9.2° C., 8.3° C. and 7.2° C., respectively. Further, the average temperature of the wafer was increased as the He pressure was decreased. When the He pressure was 10 Torr, the average temperature of the wafer was 96.6° C. Meanwhile, when the He pressure was 40 Torr, the average temperature of the wafer was 81.9° C. Therefore, the graphs were not overlapped unlike the comparative example 1.

As shown in FIG. 22C, in the test example 2, when the He pressure was 10 Torr, the temperature difference of the wafer in the region spaced from the center of the wafer by the distance of 0 to 147 nm was 9.3° C. In the same manner, in the test example 2, when the He pressures were 20 Torr, 30 Torr and 40 Torr, the temperature differences of the wafer in the region spaced from the center of the wafer by the distance of 0 to 147 nm were 7.4° C., 8.7° C. and 8.2° C., respectively. Further, the average temperature of the wafer was increased as the He pressure was increased. The graphs were not overlapped as in the test example 1.

As described above, at any He pressure, the temperature difference of the wafer in region spaced from the center of the wafer of 0 to 147 mm was smaller in the test examples 1 and 2 than in the comparative example 1. Therefore, it has been found that the non-uniform temperature distribution between the central region and the edge region of the wafer can be suppressed by decreasing the contact area ratio of the mounting surface as in the test examples 1 and 2. In other words, the use of the mounting table including the coolant path having the fin portion and the mounting surface whose contact area ratio is reduced as in the test examples 1 and 2 makes it possible to suppress the temperature increase in the edge region of the wafer and reduce the cooling capacity in the central region of the wafer. As a result, the non-uniform distribution of the temperature between the central region and the edge region of the wafer can be suppressed. Besides, it was found that the average temperature of the wafer was different at different He pressures in the test examples 1 and 2 unlike the comparative example 1. This means that the controllability of the wafer temperature by the He pressure can be increased by using the mounting table of the test examples 1 and 2.

(Effect of Temperature Singularities by the Decrease of the Contact Area Ratio)

In the test examples 3 to 5, the plasma processing was performed by using a mounting table having lifter pin holes and helium holes. In this mounting table, the contact area ratio in the central region of the mounting surface was smaller than that of the conventional mounting table. In the comparative example 2, the plasma processing was performed by using a mounting table in which the corresponding contact area ratio was the same as that of the conventional mounting table. Then, the etching rates corresponding to the azimuth of the wafer were measured. Polysilicon was used as an etching target material. The He pressure was set to 40 Torr, 20 Torr and 10 Torr (5.33×10$^3$ Pa, 2.67×10$^3$ Pa and 1.33×10$^3$ Pa). Other conditions are as follows.

(Processing Condition 4)

Pressure in the processing space S: 20 mTorr (2.67 Pa)

Power for plasma generation: 8300 W

Processing gas flow rate: 500 sccm (processing gas mainly including Ar)

Processing time: 300 sec

Figure 23:
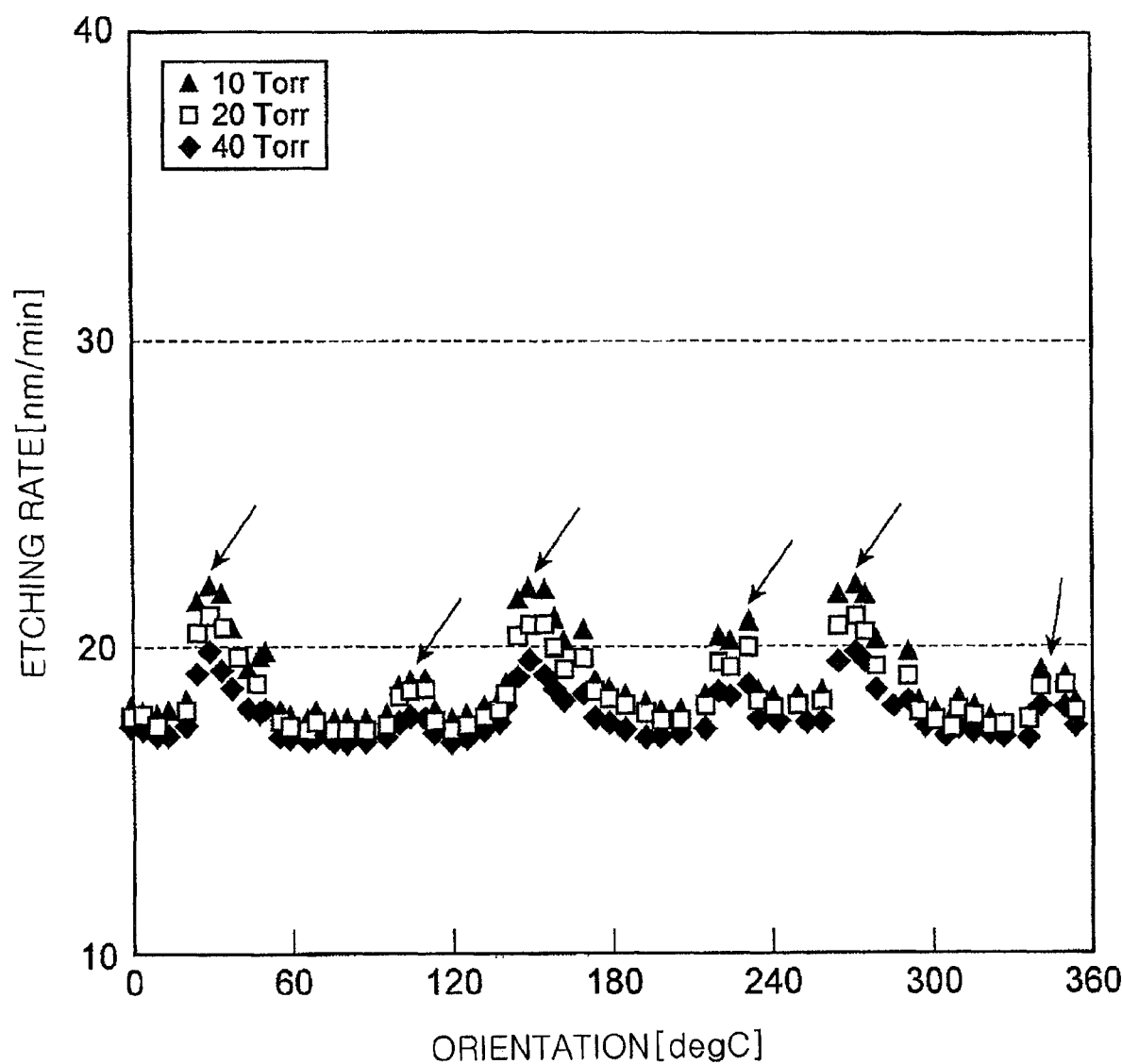
FIG. 23 is a graph showing relationship between an etching rate and an azimuth of a wafer at different He pressures in a comparative example 2.
Figure 24:
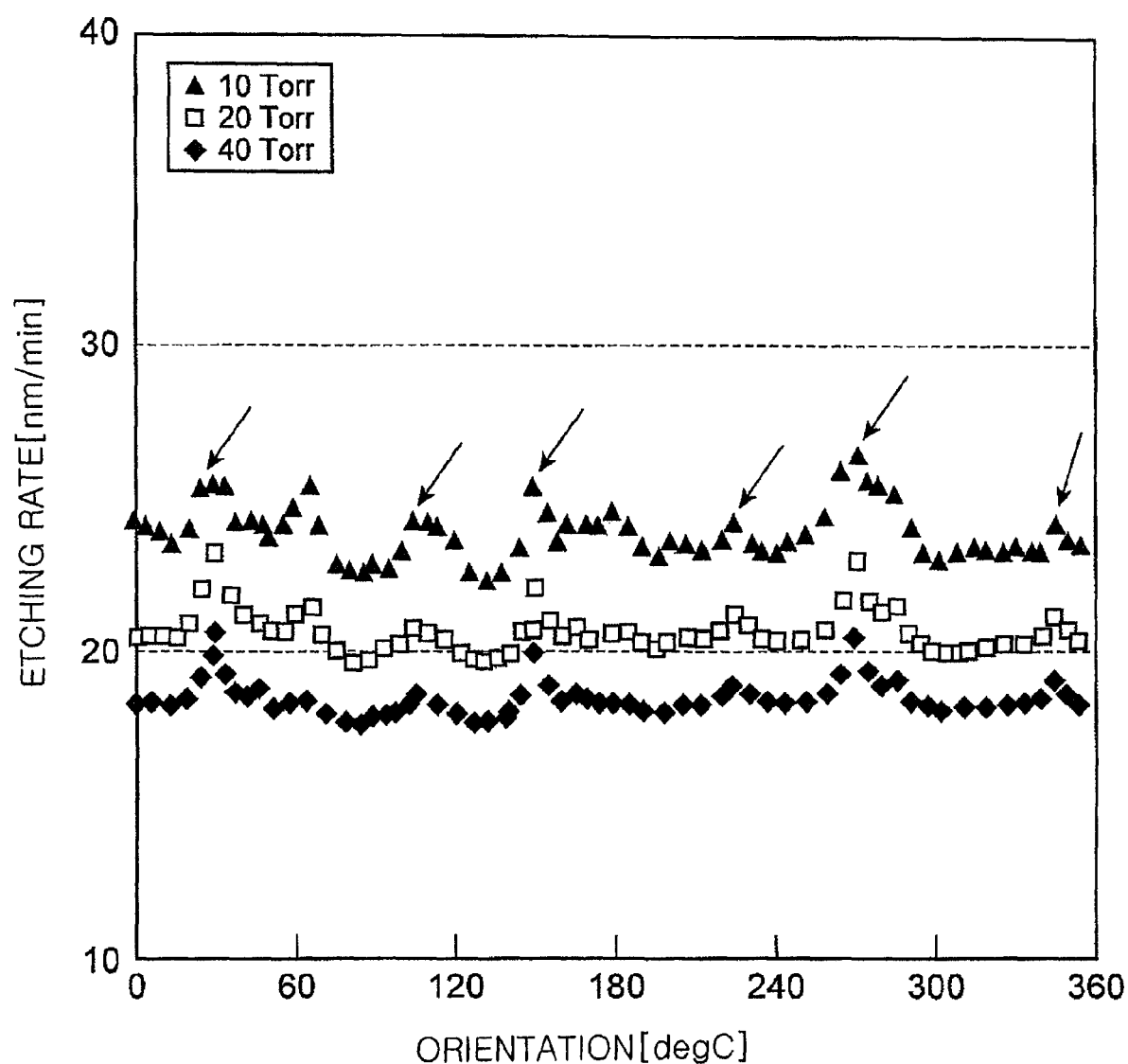
FIG. 24 is a graph showing relationship between an etching rate and an azimuth of a wafer at different He pressures in a test example 3.
Figure 25:
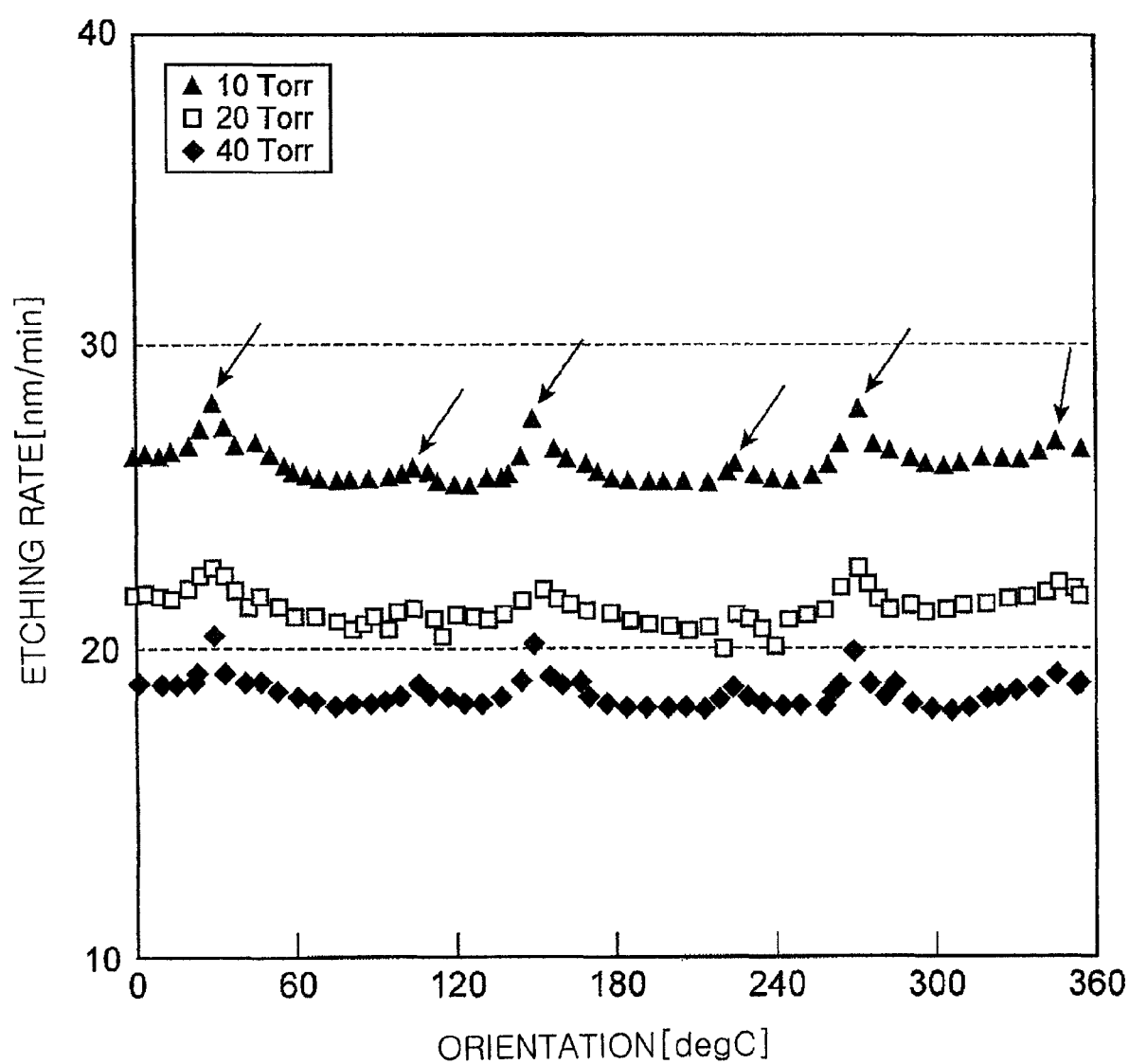
FIG. 25 is a graph showing relationship between an etching rate and an azimuth of a wafer at different He pressures in a test example 4.
Figure 26:
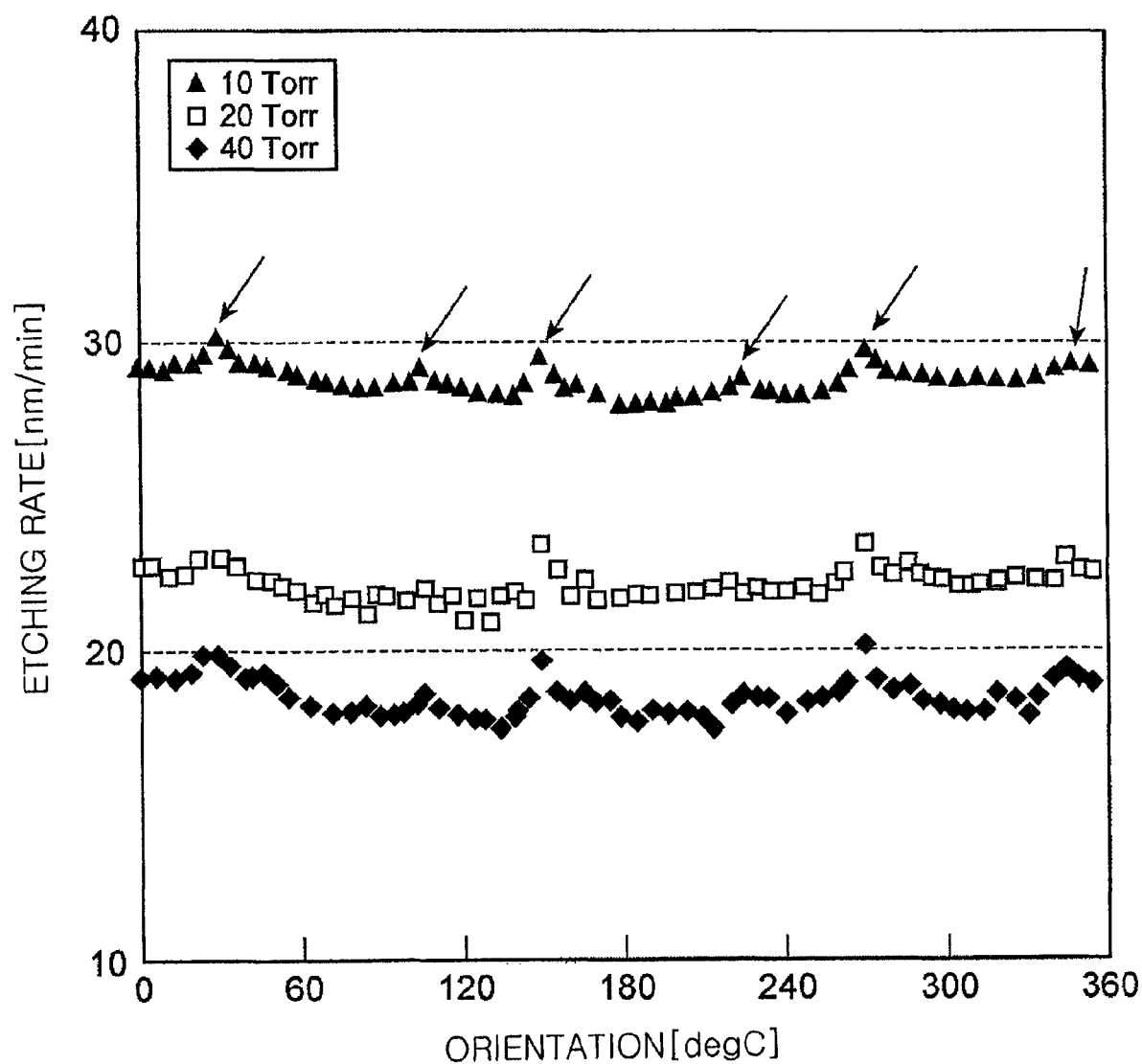
FIG. 26 is a graph showing relationship between an etching rate and an azimuth of a wafer which are measured at different He pressures in a test example 5.

FIGS. 23 to 26 show test results of the comparative example 2 and the test examples 3 to 5 in which the plasma processing was performed under the processing condition 4 and the etching rate was measured. FIGS. 23 to 26 are graphs showing relationship between the etching rate and the azimuth of the wafer at different He pressures in the comparative example 2 and the test examples 3 to 5. The horizontal axis indicates the azimuth of the wafer, and the vertical axis indicates the etching rate. FIG. 23 shows the result of the comparative example 2 using the mounting table in which the contact area ratio per unit area in the central region (0 to 130 mm) of the mounting surface is 17%. FIG. 24 shows the result of the test example 3 using the mounting table in which the contact area ratio per unit area in the central region (0 to 130 mm) of the mounting surface is 3%. FIG. 25 shows the result of the test example 4 using the mounting table in which the contact area ratio per unit area in the central region (0 to 140 mm) of the mounting surface is 0.52%. FIG. 26 shows the result of the test example 5 using the mounting table in which the contact area ratio per unit area in the central region (0 to 130 mm) of the mounting surface is 0.2%.

As shown in FIG. 23, in the comparative example 2, the etching rate was not stable, and six singularities were found as indicated by arrows in the drawing. These six singular points coincide with the azimuths of the mounting surface where the lifter pin holes are disposed. Therefore, when the contact area ratio is high, the gap between the protrusions becomes smaller than the diameter of the lifter pin holes. Accordingly, the locations of the lifter pin holes are overlapped with those of the protrusions, and the non-contact portions become singularities. Meanwhile, as shown in FIGS. 24 to 26, when the contact area ratio per unit area in the central region of the mounting surface was smaller than 12.3% of the comparative example 2, the singularities were not found and the etching rate was stable.

As shown in FIG. 23, in the comparative example 2, the etching rate was substantially the same regardless of the He pressure and the graph were substantially overlapped. Meanwhile, as shown in FIGS. 24 to 26, in the test examples 3 to 5, the etching rate was increased as the He pressure was decreased and the graphs were not overlapped. Therefore, in the test examples 3 to 5, the etching rate was different at different He pressures unlike the comparative example 2. This means that the etching rate control can be improved by using the mounting tables of the test examples 3 to 5.

While the invention has been shown and described with respect to the embodiments, it will be understood by those skilled in the art that various changes and modification may be made without departing from the scope of the invention as defined in the following claims.

What is claimed is:

1. A mounting table for mounting thereon an object to be processed, comprising:

a base portion having a coolant path formed therein; and an electrostatic chuck provided on the base portion, the electrostatic chuck having a mounting surface for mounting thereon the object and serving to electrostatically attract the object, wherein the base portion includes:
(i) a first top surface on which the electrostatic chuck is provided;
(ii) a ring-shaped second top surface provided below the first top surface at an outer side of the first top surface;
(iii) a bottom surface;
(iv) a first side surface extending in a vertical direction between the first top surface and the second top surface; and
(v) a second side surface extending in a vertical direction between the second top surface and the bottom surface;

wherein the coolant path includes:
(i) a central path configured to circulate therein a liquid coolant and extending below the first top surface; and
(ii) a L-shaped peripheral path configured to circulate therein a liquid coolant and having (a) a first portion extending below the second top surface toward the second side surface and (b) a second portion extending above the second top surface toward the first top surface along the first side surface, wherein the mounting surface includes:
(i) a central region; and
(ii) a peripheral region surrounding the central region, wherein the mounting surface has thereon a plurality of protrusions which are formed in a dot shape to contact with the backside of the object, wherein the protrusions are formed such that a contact area between the protrusions of the peripheral region and the backside of the object per unit area becomes greater than a contact area between the protrusions of the central region and the backside of the object per unit area, wherein a distance between an upper end of the second portion of the peripheral path and the first top surface is smaller than a distance between an upper end of the central path and the first top surface, wherein the second portion has a fin structure,
wherein the fin structure has a U-shaped cross section, and
wherein the fin structure extends from an upper end toward a lower end of the peripheral path along the first side surface.

2. The mounting table of claim 1, wherein the protrusions have the same shape and the same size, and the number of the protrusions of the edge region per unit area is greater than the number of the protrusions of the central region per unit area.

3. The mounting table of claim 2, wherein the mounting surface has lifter pin holes through which lifter pins for supporting the object penetrate, and a gap between the protrusions is greater than a diameter of the lifter pin holes.

4. The mounting table of claim 1, wherein the mounting surface has lifter pin holes through which lifter pins for supporting the object penetrate, and a gap between the protrusions is greater than a diameter of the lifter pin holes.

5. The mounting table of claim 1, wherein the mounting surface is provided with the protrusions throughout thereof.

6. The mounting table of claim 1, wherein the liquid coolant circulating in the central path and the liquid coolant circulating in the peripheral path are supplied from a single chiller unit.

7. The mounting table of claim 1, wherein the liquid coolant circulating in the central path is supplied from a chiller unit different from a chiller unit for the liquid coolant circulating in the peripheral path.

8. The mounting table of claim 1, wherein each of the liquid coolant circulating in the central path and the liquid coolant circulating in the peripheral path is an insulating solution.

9. A plasma processing apparatus comprising:
a mounting table for mounting thereon an object to be processed,
wherein the mounting table includes:
a base portion having a coolant path formed therein; and
an electrostatic chuck provided on the base portion, the electrostatic chuck having a mounting surface for mounting thereon the object and serving to electrostatically attract the object, wherein the base portion includes:
(i) a first top surface on which the electrostatic chuck is provided;
(ii) a ring-shaped second top surface provided below the first top surface at an outer side of the first top surface;
(iii) a bottom surface; and
(iv) a first side surface extending in a vertical direction between the first top surface and the second top surface;
(v) a second side surface extending in a vertical direction between the second top surface and the bottom surface;

wherein the coolant path includes:
(i) a central path configured to circulate therein a liquid coolant and extending below the first top surface; and
(ii) a L-shaped peripheral path configured to circulate therein a liquid coolant and having (a) a first portion extending below the second top surface toward the second side surface and (b) a second portion extending above the second top surface toward the first top surface along the first side surface, wherein the mounting surface includes:
(i) a central region; and
(ii) a peripheral region surrounding the central region, wherein the mounting surface has thereon a plurality of protrusions which are formed in a dot shape to contact with the backside of the object, wherein the protrusions are formed such that a contact area between the protrusions of the edge region and the backside of the object per unit area becomes greater than a contact area between the protrusions of the central region and the backside of the object per unit area, and wherein a distance between an upper end of the second portion of the peripheral path and the first top surface is smaller than a distance between an upper end of the central path and the first top surface, wherein the second portion has a fin structure,
wherein the fin structure has a U-shaped cross section, and
wherein the fin structure extends from an upper end toward a lower end of the peripheral path along the first side surface.

10. The plasma processing apparatus of claim 9, wherein the liquid coolant circulating in the central path and the liquid coolant circulating in the peripheral path are supplied from a single chiller unit.

11. The plasma processing apparatus of claim 9, wherein the liquid coolant circulating in the central path is supplied from a chiller unit different from a chiller unit for the liquid coolant circulating in the peripheral path.

12. The plasma processing apparatus of claim 9, wherein each of the liquid coolant circulating in the central path and the liquid coolant circulating in the peripheral path is an insulating solution.

13. A mounting table for mounting thereon an object to be processed, comprising:
- a base portion having a coolant path formed therein; and
- an electrostatic chuck provided on the base portion, the electrostatic chuck having a mounting surface for mounting thereon the object and serving to electrostatically attract the object, wherein the base portion includes:
- (i) a first top surface on which the electrostatic chuck is provided;
- (ii) a ring-shaped second top surface provided below the first top surface at an outer side of the first top surface;
- (iii) a bottom surface;
- (iv) a first side surface extending in a vertical direction between the first top surface and the second top surface; and
- (v) a second side surface extending in a vertical direction between the second top surface and the bottom surface;

wherein the coolant path includes:
- (i) a central path configured to circulate therein a liquid coolant and extending below the first top surface; and
- (ii) a L-shaped peripheral path configured to circulate therein a liquid coolant and having (a) a first portion extending below the second top surface toward the second side surface and (b) a second portion extending above the second top surface toward the first top surface along the first side surface, wherein a distance between an upper end of the second portion of the peripheral path and the first top surface is smaller than a distance between an upper end of the central path and the first top surface, wherein the second portion has a fin structure, wherein the fin structure has a U-shaped cross section, and wherein the fin structure extends from an upper end toward a lower end of the peripheral path along the first side surface.

* * * * *